US012801249B2

(12) United States Patent
Jeong et al.

(10) Patent No.: US 12,801,249 B2
(45) Date of Patent: Nov. 17, 2026

(54) ELECTRONIC DEVICE

(71) Applicant: Samsung Display Co., Ltd., Yongin-si (KR)

(72) Inventors: Hwan-Hee Jeong, Yongin-si (KR); Gyeongnam Bang, Yongin-si (KR); Jeongyun Han, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 19/375,068

(22) Filed: Oct. 30, 2025

(65) Prior Publication Data

US 2026/0219755 A1 Jul. 30, 2026

(30) Foreign Application Priority Data

Jan. 24, 2025 (KR) ........................ 10-2025-0011686

(51) Int. Cl.

| | |
|---|---|
| ***G06F 3/044*** | (2006.01) |
| ***G06F 3/041*** | (2006.01) |
| ***H10H 29/854*** | (2025.01) |
| ***H10K 59/40*** | (2023.01) |
| ***H10K 59/80*** | (2023.01) |

(52) U.S. Cl.

CPC ........ *G06F 3/0446* (2019.05); *G06F 3/04164* (2019.05); *G06F 3/0443* (2019.05); *H10H 29/854* (2025.01); *H10K 59/40* (2023.02); *H10K 59/873* (2023.02); *G06F 2203/04106* (2013.01)

(58) Field of Classification Search

CPC .. G06F 3/0446; G06F 3/04164; G06F 3/0443; G06F 2203/04106; H10K 59/40; H10K 59/873; H10H 29/854

USPC .................................................... 345/173, 76

See application file for complete search history.

(56) References Cited

U.S. PATENT DOCUMENTS

| | | | |
|---|---|---|---|
| 11,049,913 | B2 | 6/2021 | Choi et al. |
| 11,409,386 | B2 | 8/2022 | Lee et al. |
| 11,714,514 | B2 | 8/2023 | Lim et al. |
| 11,789,578 | B2 | 10/2023 | Song |
| 11,903,291 | B2 | 2/2024 | Gwon et al. |

(Continued)

FOREIGN PATENT DOCUMENTS

| | | | |
|---|---|---|---|
| CN | 104063107 | B | 2/2017 |
| CN | 110969940 | A | 4/2020 |

(Continued)

OTHER PUBLICATIONS

Extended European Search Report issued in corresponding EP Application No. 26150816.2, dated Jun. 19, 2026, 15 pages.

*Primary Examiner* — Jimmy H Nguyen

(74) *Attorney, Agent, or Firm* — Womble Bond Dickinson (US) LLP

(57) ABSTRACT

An electronic device includes a display layer and a sensor layer, the display layer including a common electrode, the sensor layer including first electrodes, second electrodes, third electrodes, and a loop trace line comprising a first line portion electrically connected to the third electrodes and extending along the first direction, a second line portion extending from an end of the first line portion in the second direction, and a third line portion extending an opposite end of the first line portion in the second direction, the second line portion and the third line portion being spaced from the common electrode in plan view.

20 Claims, 25 Drawing Sheets

(56) References Cited

U.S. PATENT DOCUMENTS

| | | | | |
|---|---|---|---|---|
| 2021/0382572 | A1* | 12/2021 | Lee | G06F 3/0412 |
| 2023/0157054 | A1 | 5/2023 | Na et al. | |
| 2024/0160325 | A1 | 5/2024 | Kim et al. | |
| 2024/0192791 | A1* | 6/2024 | Ko | G06F 1/1652 |
| 2024/0248571 | A1 | 7/2024 | Kim et al. | |
| 2024/0393908 | A1 | 11/2024 | Choi et al. | |
| 2025/0036236 | A1* | 1/2025 | Ku | G06F 3/04164 |
| 2025/0264967 | A1* | 8/2025 | Lim | G06F 3/0443 |

FOREIGN PATENT DOCUMENTS

| | | | |
|---|---|---|---|
| EP | 3 690 620 | A1 | 5/2020 |
| EP | 4 095 662 | A1 | 11/2022 |
| EP | 4 105 769 | A1 | 12/2022 |
| JP | 2017-58619 | A | 3/2017 |
| KR | 10-2021-0061808 | A | 5/2021 |
| KR | 10-2021-0152305 | A | 12/2021 |
| KR | 10-2022-0136555 | A | 10/2022 |
| KR | 10-2023-0072121 | A | 5/2023 |
| KR | 10-2024-0071450 | A | 5/2024 |
| KR | 10-2025-0018248 | A | 2/2025 |

* cited by examiner

ELECTRONIC DEVICE

CROSS-REFERENCE TO RELATED APPLICATION

The present application claims priority to, and the benefit of, Korean Patent Application No. 10-2025-0011686, filed on Jan. 24, 2025, in the Korean Intellectual Property Office, the entire disclosure of which is incorporated herein by reference.

BACKGROUND

Embodiments of the present disclosure described herein relate to an electronic device with an improved touch performance.

Each of multimedia electronic devices, such as a TV, a mobile phone, a tablet personal computer (PC), a laptop computer, a navigation system, a game console, and the like includes a display device that displays an image. In addition to a general input method, such as a button, a keyboard, a mouse, or the like, the electronic devices may include a sensor layer (or an input sensor) capable of providing a touch-based input method that allows a user to enter information or commands suitably and intuitively. The sensor layer may sense a user's touch or pressure. In the meantime, there is an increasing demand for employing a pen for a fine touch input for a user who is accustomed to entering information by using writing instruments or for a corresponding application (e.g. an application for sketching or drawing).

SUMMARY

Embodiments of the present disclosure provide an electronic device with an improved touch performance.

According to one or more embodiments of the present disclosure, an electronic device may include a display layer defining a display area configured to display an image, and a non-display area adjacent to the display area, and including a light-emitting element including a pixel electrode in the display area, an emission layer above the pixel electrode, a common electrode above the emission layer, and a dam part in the non-display area, and a sensor layer above the display layer and configured to sense an external input, and including first electrodes arranged along a first direction, second electrodes arranged along a second direction crossing the first direction, third electrodes arranged along the first direction, first trace lines electrically connected to the first electrodes in one-to-one correspondence, second trace lines electrically connected to the second electrodes in one-to-one correspondence, and a loop trace line including a first line portion electrically connected to the third electrodes and extending along the first direction, a second line portion extending from an end of the first line portion in the second direction, and spaced from the common electrode in plan view, and a third line portion extending from an opposite end of the first line portion in the second direction, and spaced from the common electrode in plan view.

The second line portion may be between the common electrode and the dam part in plan view, wherein the third line portion is between the common electrode and the dam part in plan view.

The common electrode may be between the second line portion and the third line portion in plan view.

The second trace lines may overlap the common electrode.

The display layer may further include a first inorganic encapsulation layer covering the light-emitting element, an organic encapsulation layer above the first inorganic encapsulation layer and spaced from the second line portion and the third line portion in plan view, and a second inorganic encapsulation layer above the organic encapsulation layer and covering the organic encapsulation layer.

The second line portion and the third line portion may include a first layer line, and a second layer line above and electrically connected to the first layer line, wherein the sensor layer includes an intermediate insulating layer between the first layer line and the second layer line, and defining a contact hole through which the second layer line passes.

The first layer line and the second layer line may be spaced from the dam part in plan view.

The first layer line and the second layer line may overlap the dam part.

The second trace lines may include a first layer line, and a second layer line above the first layer line and at a same layer as the second line portion and the third line portion.

The second line portion and the third line portion may overlap the dam part.

At least one of the sensor layer or the display layer may further include a mark pattern overlapping the non-display area and spaced from the loop trace line in plan view.

The loop trace line may define an opening overlapping the mark pattern.

Portions of the dam part facing the second line portion and the third line portion may extend along the second direction.

According to one or more embodiments of the present disclosure, an electronic device may include a base layer, a circuit layer above the base layer, a light-emitting element layer including a dam part, and a light-emitting element surrounded by the dam part in plan view and including a pixel electrode above the circuit layer, an emission layer above the pixel electrode, and a common electrode above the emission layer, an encapsulation layer covering the light-emitting element layer and including a first inorganic encapsulation layer covering the light-emitting element, an organic encapsulation layer above the first inorganic encapsulation layer, and a second inorganic encapsulation layer above the organic encapsulation layer and covering the organic encapsulation layer, and a sensor layer above the encapsulation layer, configured to sense an external input, and including first electrodes arranged along a first direction, second electrodes arranged along a second direction crossing the first direction, third electrodes arranged along the first direction, first trace lines electrically connected to the first electrodes in one-to-one correspondence, second trace lines electrically connected to the second electrodes in one-to-one correspondence, and a loop trace line including a first line portion electrically connected to the third electrodes and extending along the first direction, a second line portion extending from an end of the first line portion in the second direction and spaced from the organic encapsulation layer in plan view, and a third line portion extending from an opposite end of the first line portion in the second direction and spaced from the organic encapsulation layer in plan view.

The second line portion and the third line portion may be spaced from the common electrode in plan view.

The second line portion may be between the common electrode and the dam part in plan view, wherein the third line portion is between the common electrode and the dam part in plan view.

The second line portion and the third line portion may overlap the dam part.

The second trace lines may include a first layer line, and a second layer line above the first layer line and at a same layer as the second line portion and the third line portion.

According to one or more embodiments of the present disclosure, an electronic device may include a base layer, a circuit layer above the base layer, a light-emitting element layer including a dam part, and a light-emitting element surrounded by the dam part in plan view and including a pixel electrode above the circuit layer, an emission layer above the pixel electrode, and a common electrode above the emission layer, an encapsulation layer covering the light-emitting element layer, charging electrodes above the encapsulation layer, configured to sense an external input, and arranged along a first direction, and a loop trace line including a first line portion electrically connected to the charging electrodes and extending along the first direction, a second line portion spaced from the common electrode in plan view and extending from an end of the first line portion in a second direction crossing the first direction, and a third line portion spaced from the common electrode in plan view and extending from an opposite end of the first line portion in the second direction.

The electronic device may further include second trace lines including a first layer line, and a second layer line above the first layer line,

- wherein the encapsulation layer includes a first inorganic encapsulation layer covering the light-emitting element, an organic encapsulation layer above the first inorganic encapsulation layer, and a second inorganic encapsulation layer above the organic encapsulation layer and covering the organic encapsulation layer, and
- wherein the second line portion and the third line portion are spaced from the organic encapsulation layer in plan view, are at a same layer as the second layer line, and overlap the dam part.

BRIEF DESCRIPTION OF THE DRAWINGS

The above and other aspects of the present disclosure will become apparent by describing in detail embodiments thereof with reference to the accompanying drawings.

DETAILED DESCRIPTION

Figure 1:
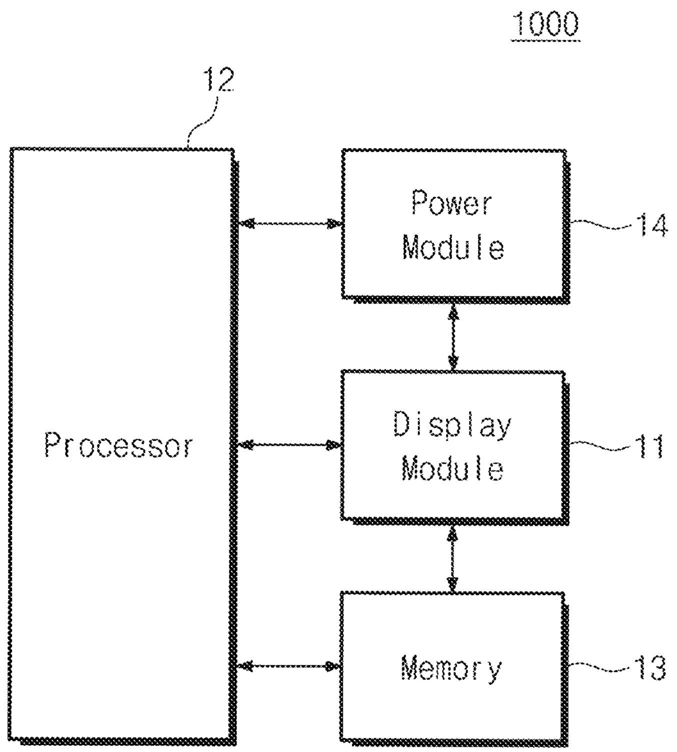
FIG. 1 is a block diagram of an electronic device according to one or more embodiments.

Aspects of some embodiments of the present disclosure and methods of accomplishing the same may be understood more readily by reference to the detailed description of embodiments and the accompanying drawings. The described embodiments are provided as examples so that this disclosure will be thorough and complete, and will fully convey the aspects of the present disclosure to those skilled in the art. Accordingly, processes, elements, and techniques that are redundant, that are unrelated or irrelevant to the description of the embodiments, or that are not necessary to those having ordinary skill in the art for a complete understanding of the aspects of the present disclosure may be omitted. Unless otherwise noted, like reference numerals, characters, or combinations thereof denote like elements throughout the attached drawings and the written description, and thus, repeated descriptions thereof may be omitted.

The described embodiments may have various modifications and may be embodied in different forms, and should not be construed as being limited to only the illustrated embodiments herein. The use of "can," "may," or "may not" in describing an embodiment corresponds to one or more embodiments of the present disclosure.

A person of ordinary skill in the art would appreciate, in view of the present disclosure in its entirety, that each suitable feature of the various embodiments of the present disclosure may be combined or combined with each other, partially or entirely, and may be technically interlocked and operated in various suitable ways, and each embodiment may be implemented independently of each other or in conjunction with each other in any suitable manner unless otherwise stated or implied.

In the drawings, the relative sizes of elements, layers, and regions may be exaggerated for clarity and/or descriptive purposes. In other words, because the sizes and thicknesses of elements in the drawings are arbitrarily illustrated for convenience of description, the disclosure is not limited thereto. Additionally, the use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified.

Various embodiments are described herein with reference to sectional illustrations that are schematic illustrations of embodiments and/or intermediate structures. As such, variations from the shapes of the illustrations as a result of, for example, manufacturing techniques and/or tolerances, are to be expected. Further, specific structural or functional descriptions disclosed herein are merely illustrative for the purpose of describing embodiments according to the concept of the present disclosure. Thus, embodiments disclosed herein should not be construed as limited to the illustrated shapes of elements, layers, or regions, but are to include deviations in shapes that result from, for instance, manufacturing.

For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place.

Spatially relative terms, such as "beneath," "below," "lower," "lower side," "under," "above," "upper," "over," "higher," "upper side," "side" (e.g., as in "sidewall"), and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below," "beneath," "or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. Similarly, when a first part is described as being arranged "on" a second part, this indicates that the first part is arranged at an upper side or a lower side of the second part without the limitation to the upper side thereof on the basis of the gravity direction.

Further, the phrase "in a plan view" means when an object portion is viewed from above, and the phrase "in a schematic cross-sectional view" means when a schematic cross-section taken by vertically cutting an object portion is viewed from the side. The terms "overlap" or "overlapped" mean that a first object may be above or below or to a side of a second object, and vice versa. Additionally, the term "overlap" may include stack, face or facing, extending over, covering, or partly covering or any other suitable term as would be appreciated and understood by those of ordinary skill in the art. The expression "not overlap" may include meaning, such as "apart from" or "set aside from" or "offset from" and any other suitable equivalents as would be appreciated and understood by those of ordinary skill in the art (e.g., spaced from in plan view). The terms "face" and "facing" may mean that a first object may directly or indirectly oppose a second object. In a case in which a third object intervenes between a first and second object, the first and second objects may be understood as being indirectly opposed to one another, although still facing each other.

It will be understood that when an element, layer, region, or component (e.g., an apparatus, a device, a circuit, a wire, an electrode, a terminal, a conductive film, etc.) is referred to as being "formed on," "on," "connected to," or "(operatively, functionally, or communicatively) coupled to" another element, layer, region, or component, it can be directly formed on, on, connected to, or coupled to the other element, layer, region, or component, or indirectly formed on, on, connected to, or coupled to the other element, layer, region, or component such that one or more intervening elements, layers, regions, or components may be present. In addition, this may collectively mean a direct or indirect coupling or connection and an integral or non-integral coupling or connection. For example, when a layer, region, or component is referred to as being "electrically connected" or "electrically coupled" to another layer, region, or component, it can be directly electrically connected or coupled to the other layer, region, and/or component or one or more intervening layers, regions, or components may be present. The one or more intervening components may include a switch, a transistor, a resistor, an inductor, a capacitor, a diode and/or the like. Accordingly, a connection is not limited to the connections illustrated in the drawings or the detailed description and may also include other types of connections. In describing embodiments, an expression of connection indicates electrical connection unless explicitly described to be direct connection, and "directly connected/directly coupled," or "directly on," refers to one component directly connecting or coupling another component, or being on another component, without an intermediate component.

In addition, in the present specification, when a portion of a layer, a film, an area, a plate, or the like is formed on another portion, a forming direction is not limited to an upper direction but includes forming the portion on a side surface or in a lower direction. On the contrary, when a portion of a layer, a film, an area, a plate, or the like is formed “under” another portion, this includes not only a case where the portion is “directly beneath” another portion but also a case where there is further another portion between the portion and another portion. Meanwhile, other expressions describing relationships between components, such as “between,” “immediately between” or “adjacent to” and “directly adjacent to,” may be construed similarly. It will be understood that when an element or layer is referred to as being “between” two elements or layers, it can be the only element or layer between the two elements or layers, or one or more intervening elements or layers may also be present.

For the purposes of this disclosure, expressions such as “at least one of,” or “any one of,” or “one or more of” when preceding a list of elements, modify the entire list of elements and do not modify the individual elements of the list. For example, “at least one of X, Y, and Z,” “at least one of X, Y, or Z,” “at least one selected from the group consisting of X, Y, and Z,” and “at least one selected from the group consisting of X, Y, or Z” may be construed as X only, Y only, Z only, any combination of two or more of X, Y, and Z, such as, for instance, XYZ, XY, YZ, and XZ, or any variation thereof. Similarly, the expressions “at least one of A and B” and “at least one of A or B” may include A, B, or A and B. As used herein, “or” generally means “and/or,” and the term “and/or” includes any and all combinations of one or more of the associated listed items. For example, the expression “A and/or B” may include A, B, or A and B. Similarly, expressions such as “at least one of,” “a plurality of,” “one of,” and other prepositional phrases, when preceding a list of elements, modify the entire list of elements and do not modify the individual elements of the list. When “C to D” is stated, it means C or more and D or less, unless otherwise specified.

It will be understood that, although the terms “first,” “second,” “third,” etc., may be used herein to describe various elements, components, regions, layers and/or sections, these elements, components, regions, layers and/or sections should not be limited by these terms. These terms do not correspond to a particular order, position, or superiority, and are only used to distinguish one element, member, component, region, area, layer, section, or portion from another element, member, component, region, area, layer, section, or portion. Thus, a first element, component, region, layer, or section described below could be termed a second element, component, region, layer, or section, without departing from the spirit and scope of the present disclosure. The description of an element as a “first” element may not require or imply the presence of a second element or other elements. The terms “first,” “second,” etc. may also be used herein to differentiate different categories or sets of elements. For conciseness, the terms “first,” “second,” etc. may represent “first-category (or first-set),” “second-category (or second-set),” etc., respectively.

In the examples, the x-axis, the y-axis, and/or the z-axis are not limited to three axes of a rectangular coordinate system, and may be interpreted in a broader sense. For example, the x-axis, the y-axis, and the z-axis may be perpendicular to one another, or may represent different directions that are not perpendicular to one another. The same applies for first, second, and/or third directions.

The terminology used herein is for the purpose of describing embodiments only and is not intended to be limiting of the present disclosure. As used herein, the singular forms “a” and “an” are intended to include the plural forms as well, while the plural forms are also intended to include the singular forms, unless the context clearly indicates otherwise. It will be further understood that the terms “comprises,” “comprising,” “have,” “having,” “includes,” and “including,” when used in this specification, specify the presence of the stated features, integers, steps, operations, elements, and/or components, but do not preclude the presence or addition of one or more other features, integers, steps, operations, elements, components, and/or groups thereof.

When one or more embodiments may be implemented differently, a specific process order may be performed differently from the described order. For example, two consecutively described processes may be performed substantially at the same time or performed in an order opposite to the described order.

As used herein, the terms “substantially,” “about,” “approximately,” and similar terms are used as terms of approximation and not as terms of degree, and are intended to account for the inherent deviations in measured or calculated values that would be recognized by those of ordinary skill in the art. For example, “substantially” may include a range of +/−5% of a corresponding value. “About” or “approximately,” as used herein, is inclusive of the stated value and means within an acceptable range of deviation for the particular value as determined by one of ordinary skill in the art, considering the measurement in question and the error associated with measurement of the particular quantity (i.e., the limitations of the measurement system). For example, “about” may mean within one or more standard deviations, or within ±30%, 20%, 10%, 5% of the stated value. Further, the use of “may” when describing embodiments of the present disclosure refers to “one or more embodiments of the present disclosure.” Furthermore, the expression “being the same” may mean “being substantially the same.” In other words, the expression “being the same” may include a range that can be tolerated by those of ordinary skill in the art. The other expressions may also be expressions from which “substantially” has been omitted.

In some embodiments well-known structures and devices may be described in the accompanying drawings in relation to one or more functional blocks (e.g., block diagrams), units, and/or modules to avoid unnecessarily obscuring various embodiments. Those skilled in the art will understand that such block, unit, and/or module are/is physically implemented by a logic circuit, an individual component, a microprocessor, a hard wire circuit, a memory element, a line connection, and other electronic circuits. This may be formed using a semiconductor-based manufacturing technique or other manufacturing techniques. The block, unit, and/or module implemented by a microprocessor or other similar hardware may be programmed and controlled using software to perform various functions discussed herein, optionally may be driven by firmware and/or software. In addition, each block, unit, and/or module may be implemented by dedicated hardware, or a combination of dedicated hardware that performs some functions and a processor (for example, one or more programmed microprocessors and related circuits) that performs a function different from those of the dedicated hardware. In addition, in some embodiments, the block, unit, and/or module may be physically separated into two or more interact individual blocks, units, and/or modules without departing from the scope of the present disclosure. In addition, in some embodiments, the block, unit and/or module may be physically combined into more complex blocks, units, and/or modules without departing from the scope of the present disclosure.

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

FIG. 1 is a block diagram of an electronic device 1000 according to one or more embodiments.

Referring to FIG. 1, the electronic device 1000 according to one or more embodiments may include a display module 11, a processor 12, a memory 13, and a power module 14.

The display module 11 may display an image. The image may include a still image as well as a moving image. The processor 12 may include at least one of a central processing unit (CPU), an application processor (AP), a graphic processing unit (GPU), a communication processor (CP), an image signal processor (ISP), or a controller. The processor 12 may be configured to control an operation of the display module 11.

Data information that are suitable for an operation of the processor 12 or the display module 11 may be stored in the memory 13. When the processor 12 executes an application stored in the memory 13, an image data signal and/or an input control signal may be transmitted to the display module 11, and the display module 11 may process the provided signal and output image information through a display screen.

The power module 14 may include a power supply module, such as a power adapter or a battery device, and a power conversion module that converts electric power supplied by the power supply module to generate electric power that is required for an operation of the electronic device 1000.

Figure 2A:
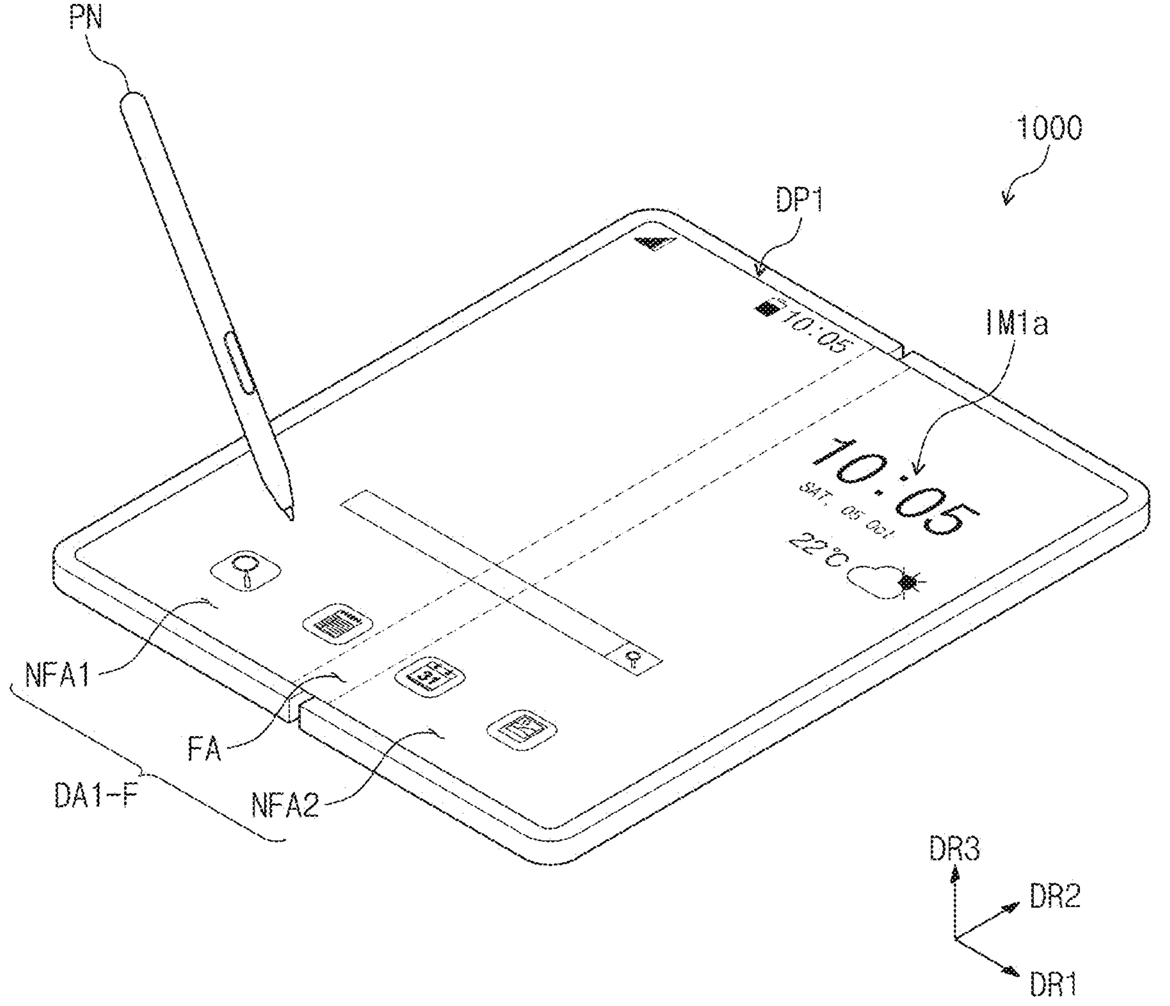
FIG. 2A is a perspective view of an electronic device according to one or more embodiments of the present disclosure.
Figure 2B:
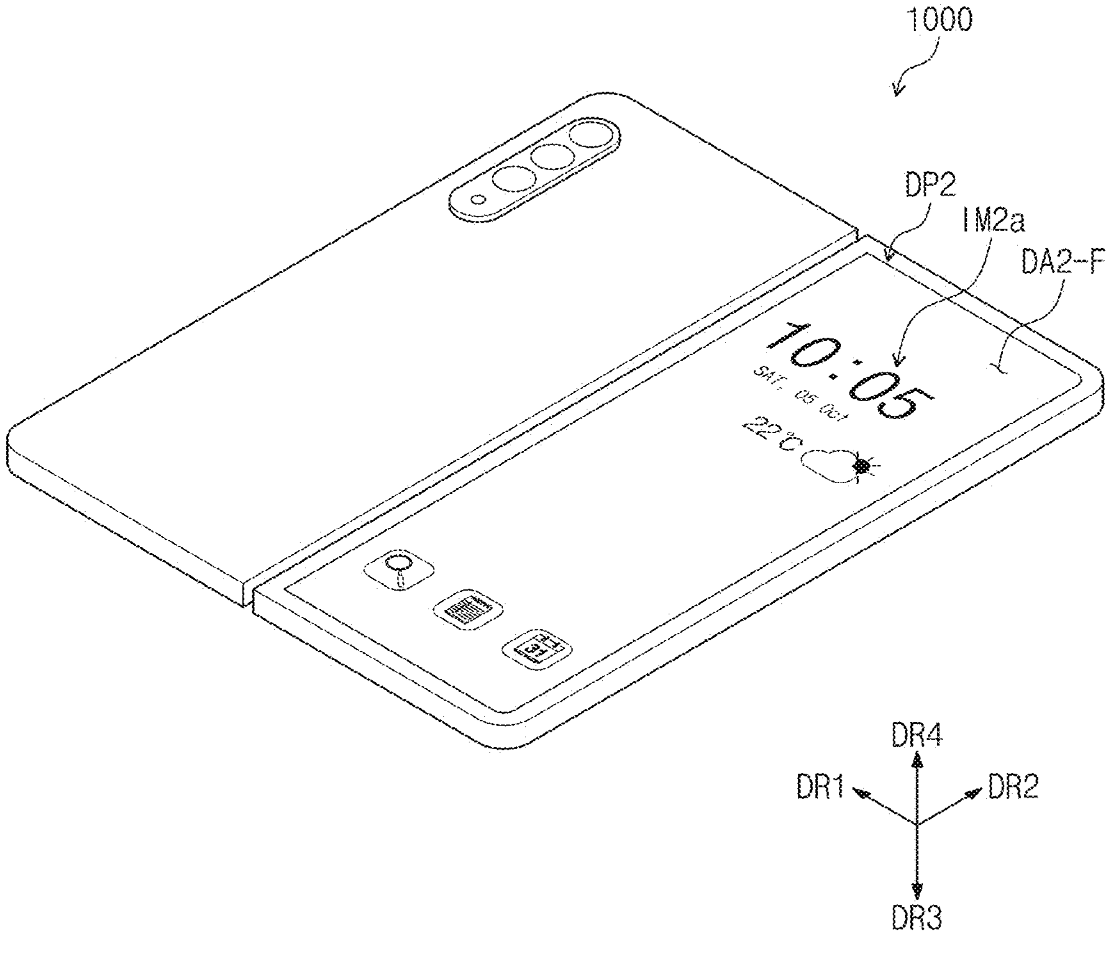
FIG. 2B is a rear perspective view of an electronic device according to one or more embodiments of the present disclosure.

FIG. 2A is a perspective view of an electronic device 1000 according to one or more embodiments of the present disclosure. FIG. 2B is a rear perspective view of the electronic device 1000 according to one or more embodiments of the present disclosure.

Referring to FIGS. 2A and 2B, the electronic device 1000 may be a device that is activated depending on an electrical signal. For example, the electronic device 1000 may display an image and may sense inputs applied from the outside. The external input may be a user input. The user input may include various types of external inputs, such as a part of the body of a user, a pen PN, light, heat, or pressure.

The electronic device 1000 may include a first display panel DP1 and a second display panel DP2. The first display panel DP1 and the second display panel DP2 may be panels that are separate from each other. The first display panel DP1 may be referred to as a main display panel, and the second display panel DP2 may be referred to as an auxiliary display panel or an external display panel.

The first display panel DP1 may include a first display part DA1-F, and the second display panel DP2 may include a second display part DA2-F. An extent of the second display panel DP2 may be smaller than an extent of the first display panel DP1. The extent of the first display part DA1-F may be greater than the extent of the second display part DA2-F to correspond to the sizes of the first display panel DP1 and the second display panel DP2.

While the electronic device 1000 is unfolded, the first display part DA1-F may have a plane that is substantially parallel to a first direction DR1 and a second direction DR2. A thickness direction of the electronic device 1000 may be parallel to a third direction DR3 that crosses the first direction DR1 and the second direction DR2. Accordingly, front surfaces (or upper surfaces) and rear surfaces (or lower surfaces) of members that constitute the electronic device 1000 may be defined with respect to the third direction DR3.

The first display panel DP1 or the first display part DA1-F may include a folding area FA that is folded and unfolded, and a plurality of non-folding areas NFA1 and NFA2 that are spaced apart from each other with the folding area FA interposed therebetween. The second display panel DP2 may overlap one of the plurality of non-folding areas NFA1 and NFA2. For example, the second display panel DP2 may overlap the first non-folding area NFA1.

A display direction of a first image IM1*a* that is displayed in the first display panel DP1 and a display direction of a second image IM2*a* that is displayed in the second display panel DP2 may be opposite to each other. For example, the first image IM1*a* may be displayed in the third direction DR3, and the second image IM2*a* may be displayed in a fourth direction DR4 that is an opposite direction to the third direction DR3.

In one or more embodiments of the present disclosure, the folding area FA may be bent with respect to a folding axis that extends in a direction that is parallel to long sides of the electronic device 1000, for example, a direction that is parallel to the second direction DR2. While the electronic device 1000 is folded, the folding area FA has a corresponding curvature and a corresponding radius of curvature. The first non-folding area NFA1 and the second non-folding area NFA2 may face each other, and the electronic device 1000 may be in-folded such that the first display part DA1-F is not exposed to the outside.

In one or more embodiments of the present disclosure, the electronic device 1000 may be out-folded such that the first display part DA1-F is exposed to the outside. In one or more embodiments of the present disclosure, the electronic device 1000 may be both in-folded and out-folded in an unfolded state, but the present disclosure is not limited thereto.

FIG. 2A illustrates that one folding area FA is defined (provided or included) in the electronic device 1000, but the present disclosure is not limited thereto. For example, a plurality of folding axes and a plurality of folding areas corresponding thereto are defined in the electronic device 1000, and the electronic device 1000 may be in-folded or out-folded while being unfolded in each of the plurality of folding areas.

According to one or more embodiments of the present disclosure, at least one of the first display panel DP1 or the second display panel DP2 may sense an input by a pen PN even when it does not include a digitizer. Accordingly, because the digitizer for sensing the pen PN is omitted, an increase in the thickness of the electronic device 1000, an increase in the weight of the electronic device 1000, or a decrease in flexibility of the electronic device 1000 may not occur due to the addition of a digitizer. Accordingly, not only the first display panel DP1 but also the second display panel DP2 may be designed to sense the pen PN.

Figure 3:
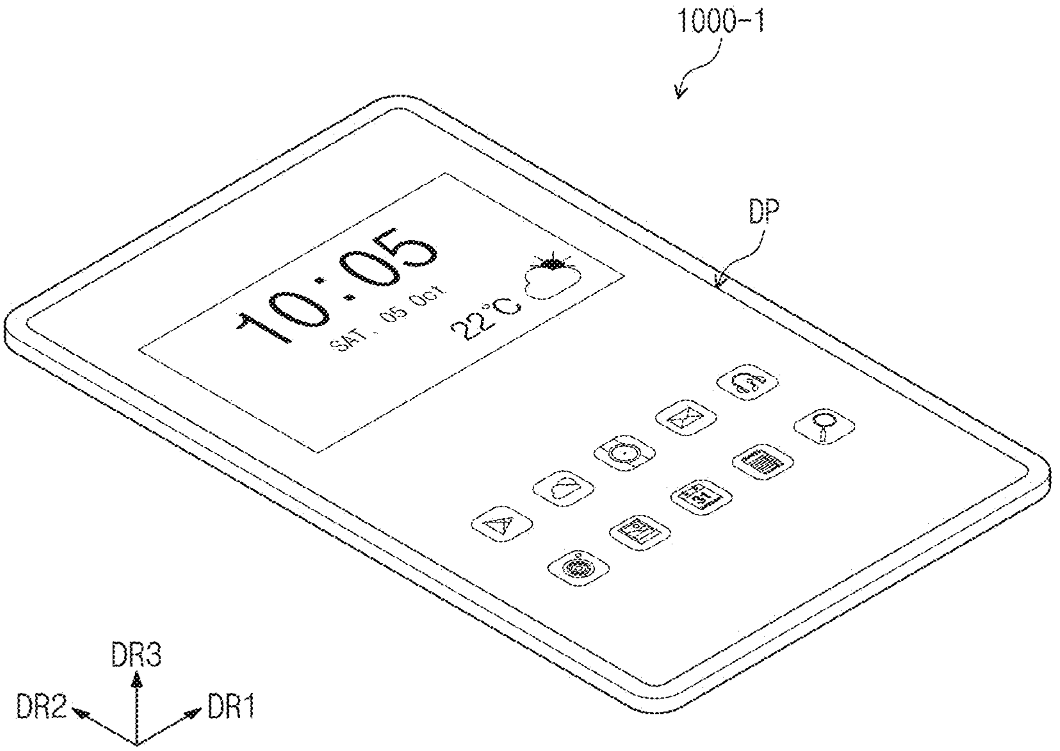
FIG. 3 is a perspective view of an electronic device according to one or more embodiments of the present disclosure.
Figure 4:
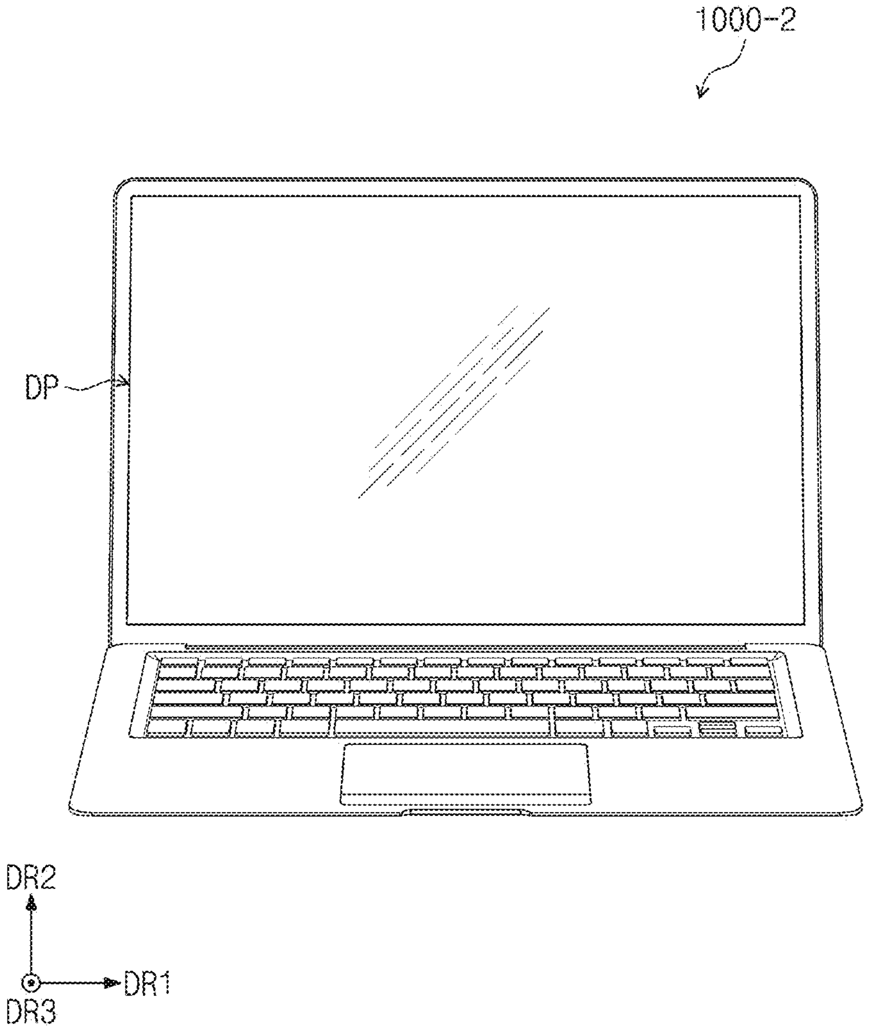
FIG. 4 is a perspective view of an electronic device according to one or more embodiments of the present disclosure.

FIG. 3 is a perspective view of an electronic device 1000-1 according to one or more embodiments of the present disclosure. FIG. 4 is a perspective view of an electronic device 1000-2 according to one or more embodiments of the present disclosure.

FIG. 3 illustrates that the electronic device 1000-1 is a bar type mobile phone, and the electronic device 1000-1 may include a display panel DP. FIG. 4 illustrates that the electronic device 1000-2 is a laptop computer PC, and the electronic device 1000-2 may include a display panel DP. FIG. 4 is a perspective view of the electronic device 1000-2, but coordinate axes included in FIG. 4 are illustrated with respect to the display panel DP in the electronic device 1000-2.

In one or more embodiments of the present disclosure, the display panel DP may sense inputs applied from the outside. The external input may be a user input. The user input may include various types of external inputs, such as a part of the body of a user, a pen PN (see FIG. 2A), light, heat, or pressure.

According to one or more embodiments of the present disclosure, the display panel DP may sense an input by the pen PN even though the display panel DP does not include a digitizer. Accordingly, because the digitizer for sensing the pen PN is omitted, the thickness and weight of the electronic device 1000-1 or 1000-2 may not be increased by the addition of a digitizer.

FIG. 2A illustrates a foldable type of the electronic device 1000, by way of example, and FIG. 3 illustrates a bar type the electronic device 1000-1, by way of example, but the present disclosure described below is not limited thereto. For example, the descriptions made below may be applied to various electronic devices, such as a rollable electronic device, a slidable electronic device, and a stretchable electronic device.

Figure 5:
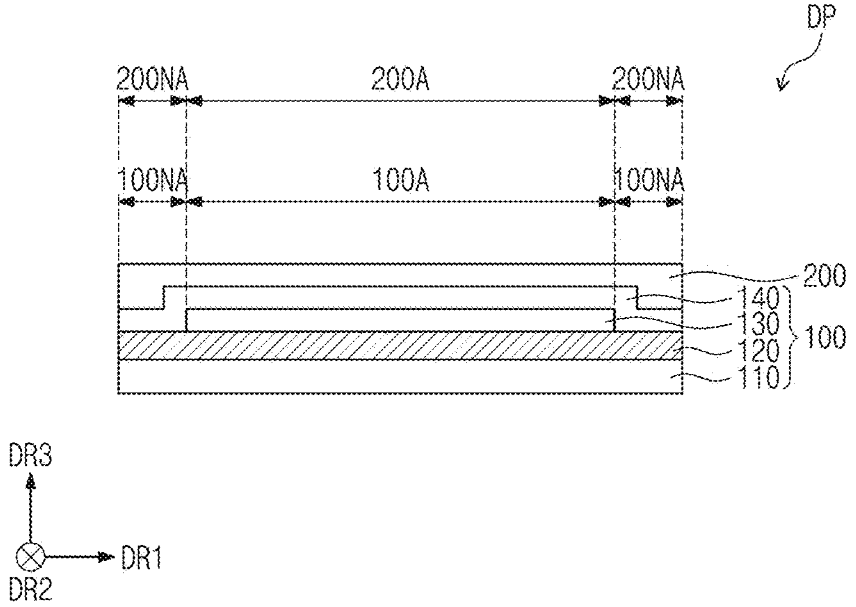
FIG. 5 is a schematic cross-sectional view of a display panel according to one or more embodiments of the present disclosure.

FIG. 5 is a schematic cross-sectional view of the display panel DP according to one or more embodiments of the present disclosure.

Referring to FIG. 5, the display panel DP may include a display layer 100 and a sensor layer 200. An upper functional member may be further located on the sensor layer 200 (as used herein "located on" may mean "above"). For example, the upper functional member may include at least one of a reflection reduction/prevention layer, a window, or a protective film.

The display layer 100 may be a component that substantially generates an image. A display area 100A and a non-display area 100NA that is adjacent to the display area 100A may be defined in the display layer 100. An image may be displayed on the display area 100A.

The display layer 100 may be a light-emitting display layer, and for example, the display layer 100 may be an organic light-emitting display layer, an inorganic light-emitting display layer, an organic-inorganic light-emitting display layer, a quantum dot display layer, a micro-LED display layer, or a nano-LED display layer. The display layer 100 may include a base layer 110, a circuit layer 120, a light-emitting element layer 130, and an encapsulation layer 140.

The base layer 110 may be a member that provides a base surface, on which the circuit layer 120 is located. The base layer 110 may include a multi-layer structure or a single layer structure. The base layer 110 may be a glass substrate, a metal substrate, a silicon substrate, or a polymer substrate, but the present disclosure is not particularly limited thereto.

The circuit layer 120 may be located on the base layer 110. The circuit layer 120 may include an insulating layer, a semiconductor pattern, a conductive pattern, and a signal line. The insulating layer, the semiconductor layer, and the conductive layer may be formed on the base layer 110 through coating, evaporation, or the like, and the insulating layer, the semiconductor layer, and the conductive layer may be selectively patterned through a plurality of photolithography processes.

The light-emitting element layer 130 may be located on the circuit layer 120. The light-emitting element layer 130 may include a light-emitting element. For example, the light-emitting element layer 130 may include an organic light-emitting material, an inorganic light-emitting material, an organic-inorganic light-emitting material, a quantum dot, a quantum rod, a micro-LED, or a nano-LED.

The encapsulation layer 140 may be located on the light-emitting element layer 130. The encapsulation layer 140 may protect the light-emitting element layer 130 from foreign substances, such as moisture, oxygen, and dust particles.

The sensor layer 200 may be located on the display layer 100. A sensing area 200A, and a peripheral area 200NA that is adjacent to the sensing area 200A may be defined in the sensor layer 200. The sensing area 200A may overlap the display area 100A, and the peripheral area 200NA may overlap the non-display area 100NA.

According to one or more embodiments of the present disclosure, the extent of the sensing area 200A may be the extent of the display area 100A or more. FIG. 5 illustrates as an example that the extent of the sensing area 200A and the extent of the display area 100A are the same, but the present disclosure is not limited thereto. For example, a portion of the sensing area 200A may overlap the non-display area 100NA, and the extent of the sensing area 200A may be greater than the extent of the display area 100A. In this case, even when an input occurs adjacently to a boundary between the display area 100A and the non-display area 100NA, a signal may be sufficiently recognized because the sensing area 200A also overlaps a portion of the non-display area 100NA. Accordingly, a coordinate accuracy of a touch that is input to an outskirt of the display area 100A may be further improved.

The sensor layer 200 may sense an external input that is applied from the outside. The sensor layer 200 may be an integrated sensor that is formed continuously during the manufacturing process of the display layer 100, or may be an external sensor that is attached to the display layer 100. The sensor layer 200 may be referred to as a sensor, an input sensing layer, an input sensing panel, or an electronic device for sensing input coordinates.

According to one or more embodiments of the present disclosure, the sensor layer 200 may sense both inputs by a passive type input means, such as the user's body, and an input by an input device that generates a magnetic field of a corresponding resonant frequency. The input device may be referred to as a pen, an input pen, a magnetic pen, a stylus pen, or an electromagnetic resonance pen.

Figure 6:
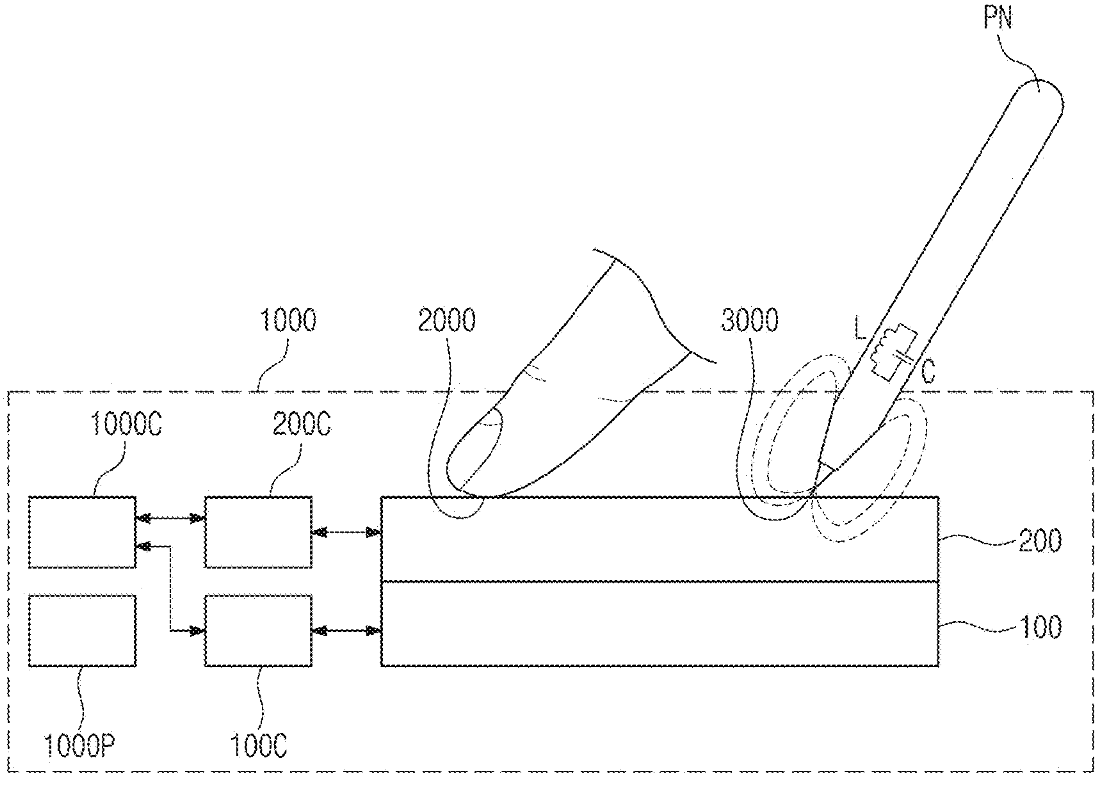
FIG. 6 is a block diagram illustrating an operation of an electronic device according to one or more embodiments of the present disclosure.

FIG. 6 is a block diagram illustrating an operation of the electronic device 1000 according to one or more embodiments of the present disclosure.

Referring to FIG. 6, the electronic device 1000 may include a display layer 100, a sensor layer 200, a display driver 100C, a sensor driver 200C, a main driver 1000C, and a power circuit 1000P.

The sensor layer 200 may sense a first input 2000 or a second input 3000 that is applied from the outside. Each of the first input 2000 and the second input 3000 may be an input by an input means that may provide a change in the capacitance of the sensor layer 200 or an input by an input means that may cause an induced current in the sensor layer 200. For example, the first input 2000 may be an input by a passive type input means, such as a user's body. The second input 3000 may be an input by a pen PN or an input by an RFIC tag. For example, the pen PN may be a passive type pen or an active type pen.

In one or more embodiments of the present disclosure, the pen PN may be a device that generates a magnetic field of a corresponding resonant frequency. The pen PN may be configured to transmit an output signal based on an electromagnetic resonance method. The pen PN may be referred to as an input device, an input pen, a magnetic pen, a stylus pen, or an electromagnetic resonance pen.

The pen PN may include an RLC resonant circuit, and the RLC resonant circuit may include an inductor "L" and a capacitor "C". In one or more embodiments of the present disclosure, the RLC resonant circuit may be a variable resonant circuit that changes a resonance frequency. In this case, the inductor "L" may be a variable inductor and/or the capacitor "C" may be a variable capacitor, but the present disclosure is not particularly limited thereto.

The inductor "L" generates a current by a magnetic field that is formed in the electronic device 1000, for example, in the sensor layer 200. However, the present disclosure is not particularly limited thereto. For example, when the pen PN is operated in an active type, the pen PN may generate a current even when the pen PN does not receive a magnetic field from the outside. The generated current is delivered to the capacitor "C". The capacitor "C" charges the current that is input from the inductor "L", and discharges the charged current to the inductor "L". Thereafter, the inductor "L" may emit a magnetic field of a resonant frequency. An induction current may flow through the sensor layer 200 by the magnetic field emitted by the pen PN, and the induction current may be transmitted to the sensor driver 200C as a reception signal (or a sensing signal).

The main driver 1000C may control overall operations of the electronic device 1000. For example, the main driver 1000C may control the operations of the display driver 100C and the sensor driver 200C. The main driver 1000C may include at least one microprocessor, and may further include a graphics controller. The main driver 1000C may be referred to as an application processor, a central processing unit, or a main processor.

The display driver 100C may drive the display layer 100. The display driver 100C may receive image data and a control signal from the main driver 1000C. The control signal may include various signals. For example, the control signal may include an input vertical synchronization signal, an input horizontal synchronization signal, a main clock signal, and a data enable signal.

The sensor driver 200C may drive the sensor layer 200. The sensor driver 200C may receive a control signal from the main driver 1000C. The control signal may include a clock signal of the sensor driver 200C. Moreover, the control signal may further include a mode determination signal that determines operation modes of the sensor driver 200C and the sensor layer 200.

The sensor driver 200C may be implemented as an integrated circuit (IC) and may be electrically connected to the sensor layer 200. For example, the sensor driver 200C may be mounted directly on a corresponding area of the display panel or mounted on a separate printed circuit board in a chip-on-film (COF) method to be electrically connected to the sensor layer 200.

The sensor driver 200C and the sensor layer 200 may be selectively operated in a first mode or a second mode. For example, the first mode may be a mode, in which a touch input, for example, the first input 2000 is sensed. The second mode may be a mode, in which an input of the pen PN, for example, the second input 3000 is sensed. The first mode may be referred to as a touch-sensing mode, and the second mode may be referred to as a pen-sensing mode.

The switching between the first mode and the second mode may be accomplished in various manners. For example, the sensor driver 200C and the sensor layer 200 may be driven in a time-division method in the first mode and the second mode and may sense the first input 2000 and the second input 3000. Alternatively, the switching between the first mode and the second mode may be made due to a user's selection or the user's corresponding action (or input), any one of the first mode and the second mode may be activated or deactivated by activating or deactivating a corresponding application, or one mode may be switched to the other mode. Alternatively, while being alternately operated in the first mode and the second mode, the sensor driver 200C and the sensor layer 200 may be maintained in the first mode when the first input 2000 is sensed, or may be maintained in the second mode when the second input 3000 is sensed.

The sensor driver 200C may calculate coordinate information of an input based on a signal that is received from the sensor layer 200, and may provide the main driver 1000C with a coordinate signal having the coordinate information. The main driver 1000C executes an operation corresponding to a user input based on the coordinate signal. For example, the main driver 1000C may operate the display driver 100C such that a new application image is displayed on the display layer 100.

The power circuit 1000P may include a power management integrated circuit (PMIC). The power circuit 1000P may generate a plurality of driving voltages for driving the display layer 100, the sensor layer 200, the display driver 100C, and the sensor driver 200C. For example, the plurality of driving voltages may include a gate high voltage, a gate low voltage, a first driving voltage, a second driving voltage, an initialization voltage, and the like, but the present disclosure is not particularly limited to the above example.

Figure 7A:
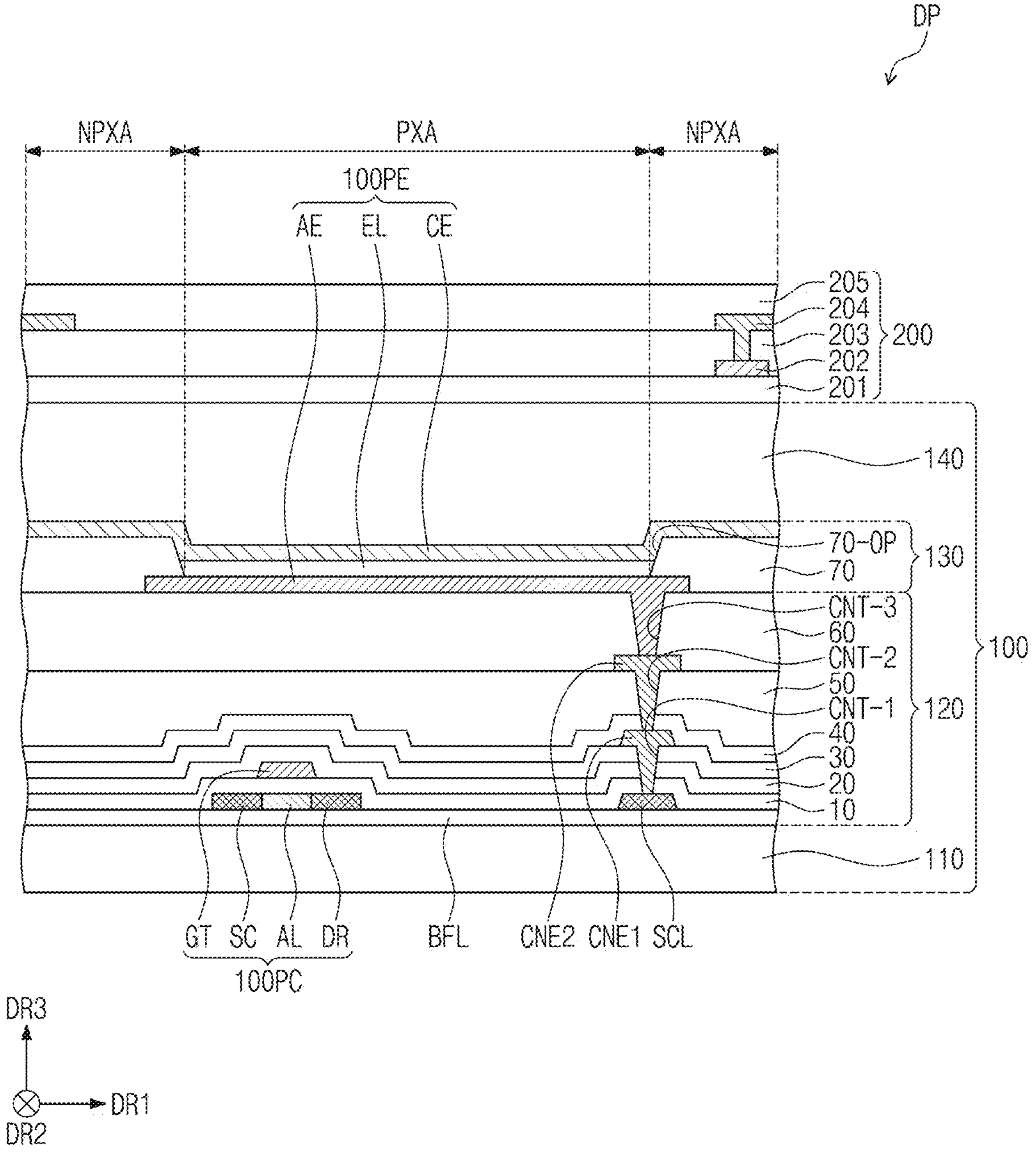
FIG. 7A is a cross-sectional view of a display panel according to one or more embodiments of the present disclosure.

FIG. 7A is a cross-sectional view of the display panel DP according to one or more embodiments of the present disclosure.

Referring to FIG. 7A, at least one buffer layer BFL is formed on an upper surface of the base layer 110. The buffer layer BFL may improve a bonding force between the base layer 110 and a semiconductor pattern. The buffer layer BFL may be formed of multi-layers. Alternatively, the display layer 100 may further include a barrier layer. The buffer layer BFL may include at least one of silicon oxide, silicon nitride, or silicon oxynitride. For example, the buffer layer BFL may include a structure, in which silicon oxide layers and silicon nitride layers are laminated alternately.

The semiconductor patterns SC, AL, DR, and SCL may be located on the buffer layer BFL. The semiconductor patterns SC, AL, DR, and SCL may include polysilicon. However, the present disclosure is not limited thereto, and the semiconductor patterns SC, AL, DR, and SCL may include amorphous silicon, low-temperature polycrystalline silicon, or an oxide semiconductor.

FIG. 7A only illustrates some semiconductor patterns SC, AL, DR, and SCL, and a semiconductor pattern may be further located in another area. The semiconductor patterns SC, AL, DR, and SCL may be arranged over pixels in a corresponding rule. The semiconductor patterns SC, AL, DR, and SCL may have a different electrical property depending on whether they are doped. The semiconductor patterns SC, AL, DR, and SCL may include first areas SC, DR, and SCL having a high conductivity, and a second area AL having a low conductivity. The first areas SC, DR, and SCL may be doped with an N-type dopant or a P-type dopant. A P-type transistor may include an area doped with the P-type dopant, and an N-type transistor may include an area doped with the N-type dopant. The second area AL may be a non-doped area or an area that is doped at a concentration lower than those of the first area SC, DR, and SCL.

A conductivity of the first areas SC, DR, and SCL is greater than a conductivity of the second area AL, and the first areas SC, DR, and SCL may substantially serve as an electrode or a signal line. The second area AL may substantially correspond to an active area AL (or a channel) of a transistor 100PC. In other words, a portion AL of the semiconductor patterns SC, AL, DR, and SCL may be the active area AL of a transistor 100PC, other portions SC and DR may be the source area SC or the drain area DR of the transistor 100PC, and the other portion SCL may be a connection electrode or a connection signal line SCL.

Each of pixels may have an equivalent circuit including a plurality of transistors, at least one capacitor, and at least one light-emitting element, and the equivalent circuit of the pixel may be modified in various forms. FIG. 7A illustrates one transistor 100PC and one light-emitting element 100PE included in a pixel, by way of example.

The source area SC, the active area AL, and the drain area DR of the transistor 100PC may be formed from the semiconductor patterns SC, AL, DR, and SCL. The source area SC and the drain area DR may extend in opposite directions from the active area AL on a cross section. FIG. 7A illustrates a portion of the connection signal line SCL formed from the semiconductor patterns SC, AL, DR, and SCL. Although not separately illustrated, the connection signal line SCL may be connected to the drain area DR of the transistor 100PC on a plane.

A first insulating layer 10 may be located on the buffer layer BFL. The first insulating layer 10 may overlap a plurality of pixels in common, and may cover the semiconductor patterns SC, AL, DR, and SCL. The first insulating layer 10 may be an inorganic layer and/or an organic layer, and may have a single layer or multi-layer structure. The first insulating layer 10 may include at least one of aluminum oxide, titanium oxide, silicon oxide, silicon nitride, silicon oxynitride, zirconium oxide, or hafnium oxide. In one or more embodiments, the first insulating layer 10 may be a single-layered silicon oxide layer. Not only the first insulating layer 10, but also an insulating layer of the circuit layer 120 that will be described later, may be an inorganic layer and/or an organic layer, and may have a single layer or multi-layer structure. The inorganic layer may include at least one of the above-described materials, but the present disclosure is not limited thereto.

A gate GT of the transistor 100PC is located on the first insulating layer 10. The gate GT may be a portion of a metal pattern. The gate GT overlaps the active area AL. The gate GT may function as a mask in a process of doping or reducing the semiconductor patterns SC, AL, DR, and SCL.

A second insulating layer 20 is located on the first insulating layer 10, and may cover the gate GT. The second insulating layer 20 may overlap the pixels in common. The second insulating layer 20 may be an inorganic layer and/or an organic layer, and may have a single layer or multi-layer structure. The second insulating layer 20 may include at least one of silicon oxide, silicon nitride, or silicon oxynitride. In one or more embodiments, the second insulating layer 20 may have a multi-layer structure including a silicon oxide layer and a silicon nitride layer.

A third insulating layer 30 may be located on the second insulating layer 20. The third insulating layer 30 may have a single layer or multi-layer structure. For example, the third insulating layer 30 may have a multi-layer structure including a silicon oxide layer and a silicon nitride layer.

A first connection electrode CNE1 may be located on the third insulating layer 30. The first connection electrode CNE1 may be connected to the connection signal line SCL through a contact hole CNT-1 that passes through the first, second, and third insulating layers 10, 20, and 30.

A fourth insulating layer 40 may be located on the third insulating layer 30. The fourth insulating layer 40 may be a single-layered silicon oxide layer. A fifth insulating layer 50 may be located on the fourth insulating layer 40. The fifth insulating layer 50 may be an organic layer.

A second connection electrode CNE2 may be located on the fifth insulating layer 50. The second connection electrode CNE2 may be connected to the first connection electrode CNE1 through a contact hole CNT-2 passing through the fourth insulating layer 40 and the fifth insulating layer 50.

A sixth insulating layer 60 may be located on the fifth insulating layer 50 and may cover the second connection electrode CNE2. The sixth insulating layer 60 may be an organic layer.

The light-emitting element layer 130 may be located on the circuit layer 120. The light-emitting element layer 130 may include a light-emitting element 100PE. For example, the light-emitting element layer 130 may include an organic light-emitting material, an inorganic light-emitting material, an organic-inorganic light-emitting material, a quantum dot, a quantum rod, a micro-LED, or a nano-LED. Hereinafter, an example of the light-emitting element 100PE being an organic light-emitting element will be described, but the present disclosure is not particularly limited thereto.

The light-emitting element 100PE may include a first electrode AE, an emission layer EL, and a second electrode CE. The light-emitting element 100PE may be located in the display area 100A (see FIG. 5). The first electrode AE may be referred to as a pixel electrode, and the second electrode CE may be referred to as a common electrode.

The first electrode AE may be located on the sixth insulating layer 60. The first electrode AE may be connected to the second connection electrode CNE2 through a contact hole CNT-3 that passes through the sixth insulating layer 60.

A pixel definition film 70 may be located on the sixth insulating layer 60, and may cover a portion of the first electrode AE. An opening 70-OP is defined in the pixel definition film 70. The opening 70-OP of the pixel definition film 70 exposes at least portion of the first electrode AE.

The display area 100A (see FIG. 5) may include an emission area PXA, and a non-emission area NPXA that is adjacent to the emission area PXA. The non-emission area NPXA may surround the emission area PXA. In one or more embodiments, the emission area PXA is defined as corresponding to a partial area of the first electrode AE, which is exposed by the opening 70-OP.

The emission layer EL may be located on the first electrode AE. The emission layer EL may be located in an area corresponding to the opening 70-OP. FIG. 7A illustrates as an example that the emission layer EL is located in the opening 70-OP, but the present disclosure is not particularly limited thereto. For example, the emission layer EL may extend to cover a side surface of the pixel definition film 70 that defining the opening 70-OP and a portion of an upper surface of the pixel definition film 70.

In one or more embodiments of the present disclosure, the emission layer EL may be separately included on each of pixels. When the emission layers EL are separately formed in each of pixels, each of the emission layers EL may emit light of at least one of a blue color, a red color, or a green color. However, the present disclosure is not limited thereto, and the emission layer EL may have an integral shape, and may be included in the plurality of pixels in common. In this case, the emission layer EL may provide blue light or white light.

The second electrode CE may be located on the emission layer EL. The second electrode CE may have an integral shape, and may be included in a plurality of pixels in common.

In one or more embodiments of the present disclosure, a hole control layer may be interposed between the first electrode AE and the emission layer EL. The hole control layer may be located in common in the emission area PXA and the non-emission area NPXA. The hole control layer may include a hole transport layer, and may further include a hole injection layer. An electron control layer may be interposed between the emission layer EL and the second electrode CE. The electron control layer may include an electron transport layer, and may further include an electron injection layer. The hole control layer and the electron control layer may be formed in common in a plurality of pixels by using an open mask or inkjet process.

The encapsulation layer 140 may be located on the light-emitting element layer 130. The encapsulation layer 140 may include an inorganic layer, an organic layer, and an inorganic layer that are sequentially laminated, and layers that constitute the encapsulation layer 140 are not limited thereto. The inorganic layers may protect the light-emitting element layer 130 from moisture and oxygen, and the organic layer may protect the light-emitting element layer 130 from a foreign material, such as dust particles. The inorganic layers may include a silicon nitride layer, a silicon oxynitride layer, a silicon oxide layer, a titanium oxide layer, an aluminum oxide layer, or the like. The organic layer may include, without being limited thereto, an acrylic-based organic layer.

The sensor layer 200 may include a base layer 201, a first conductive layer 202, an intermediate insulating layer 203, a second conductive layer 204, and a cover insulating layer 205.

The base layer 201 may be an inorganic layer including at least one of silicon nitride, silicon oxynitride, or silicon oxide. Alternatively, the base layer 201 may be an organic layer including an epoxy resin, an acrylate resin, or an imide-based resin. The base layer 201 may have a single layer structure or may have a multi-layer structure that is laminated in the third direction DR3. In one or more embodiments of the present disclosure, the sensor layer 200 may not include the base layer 201.

Each of the first conductive layer 202 and the second conductive layer 204 may have a single layer structure, or may have a multi-layer structure, in which layers are laminated in the third direction DR3.

Each of the first conductive layer 202 and the second conductive layer 204 of a single layer structure may include a metal layer or a transparent conductive layer. The metal layer may include molybdenum, silver, titanium, copper, aluminum, or an alloy thereof. The transparent conductive layer may include a transparent conductive oxide, such as indium tin oxide (ITO), indium zinc oxide (IZO), zinc oxide (ZnO), indium zinc tin oxide (IZTO), or the like. In addition, the transparent conductive layer may include a conductive polymer, such as poly(3,4-ethylenedioxythiophene) (PEDOT), a metal nano wire, graphene, and the like.

Each of the first conductive layer 202 and the second conductive layer 204 of the multi-layer structure may include metal layers. For example, the metal layers may have a three-layer structure of titanium/aluminum/titanium. The conductive layer of the multi-layer structure may include at least one metal layer and at least one transparent conductive layer.

In one or more embodiments of the present disclosure, a thickness of the first conductive layer 202 may be greater than or equal to a thickness of the second conductive layer 204. When the thickness of the first conductive layer 202 is greater than the thickness of the second conductive layer 204, a resistance of a component (e.g., an electrode, a pattern, or a bridge pattern) included in the first conductive layer 202 may be reduced. Furthermore, because the first conductive layer 202 is located under the second conductive layer 204, a probability that components included in the first conductive layer 202 are to be visually recognized by external light reflection may be lower than that of the second conductive layer 204, even though the thickness of the first conductive layer 202 is increased.

At least one of the intermediate insulating layer 203 or the cover insulating layer 205 may include an inorganic film. The inorganic film may include at least one of aluminum oxide, titanium oxide, silicon oxide, silicon nitride, silicon oxynitride, zirconium oxide, or hafnium oxide.

At least one of the intermediate insulating layer 203 or the cover insulating layer 205 may include an organic film. The organic film may include at least one of acrylate-based resin, methacrylate-based resin, polyisoprene, vinyl-based resin, epoxy-based resin, urethane-based resin, cellulose-based resin, siloxane-based resin, polyimide-based resin, polyamide-based resin, or perylene-based resin.

Although it has been described above that the sensor layer 200 includes a total of two conductive layers, that is, the first conductive layer 202 and the second conductive layer 204, but the present disclosure is not particularly limited thereto. For example, the sensor layer 200 may include three or more conductive layers.

Figure 7B:
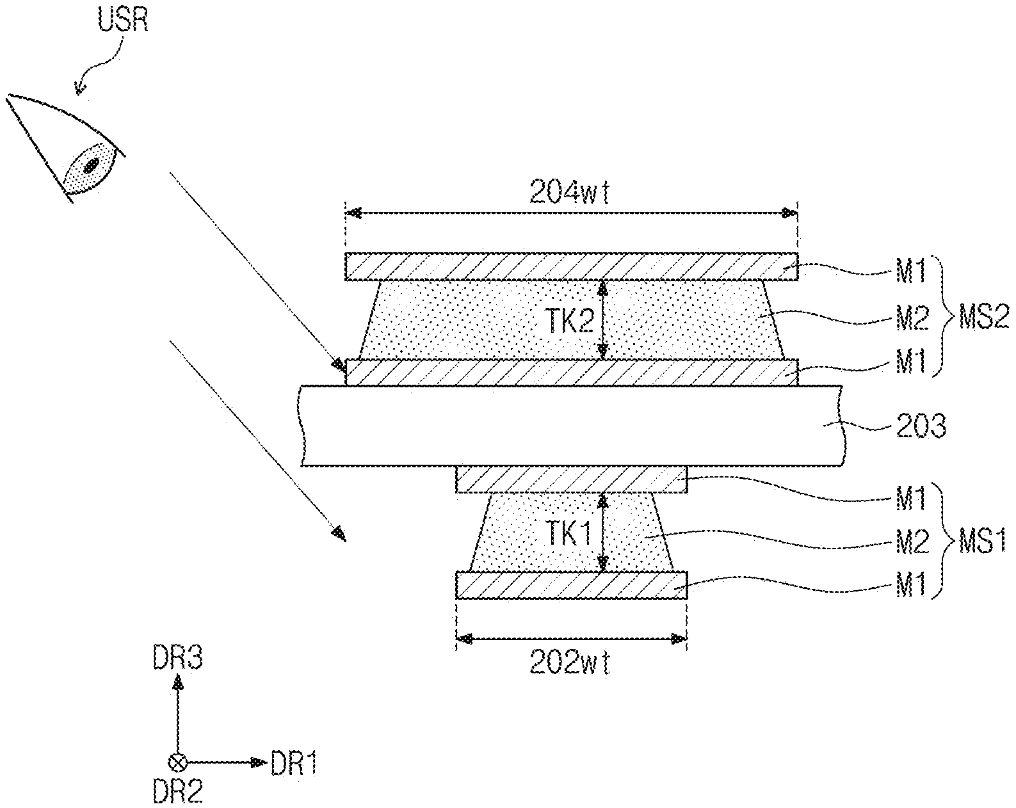
FIG. 7B is a cross-sectional view illustrating some components of a sensor layer according to one or more embodiments of the present disclosure.

FIG. 7B is a cross-sectional view illustrating some components of a sensor layer 200-1 (see FIG. 7) according to one or more embodiments of the present disclosure.

Referring to FIGS. 7A and 7B, a second width 204*wt* of a second mesh line MS2 included in the second conductive layer 204 may be greater than or equal to a first width 202*wt* of a first mesh line MS1 included in the first conductive layer 202. When a user USR watches the first mesh line MS1 and the second mesh line MS2 from a lateral side, the first mesh line MS1 has a smaller width than that of the second mesh line MS2, and thus a probability that the first mesh line MS1 is to be visually recognized by the user USR may be reduced.

Each of the first mesh line MS1 and the second mesh line MS2 may include first metal layers M1 and a second metal layer M2 that is located between the first metal layers M1. The first metal layers M1 may include titanium (Ti), and the second metal layer M2 may include aluminum (Al). However, this is only an example, and the present disclosure is not particularly limited thereto.

In one or more embodiments of the present disclosure, a first thickness TK1 of the second metal layer M2 of the first mesh line MS1 and a second thickness TK2 of the second metal layer M2 of the second mesh line MS2 may be substantially the same, but the present disclosure is not particularly limited thereto. For example, the first thickness TK1 may be larger than the second thickness TK2. Alternatively, the second thickness TK2 may be larger than the first thickness TK1. In one or more embodiments of the present disclosure, each of the first thickness TK1 and the second thickness TK2 may be about 1000 Angstrom or more, and for example, about 6000 Angstrom.

Figure 8:
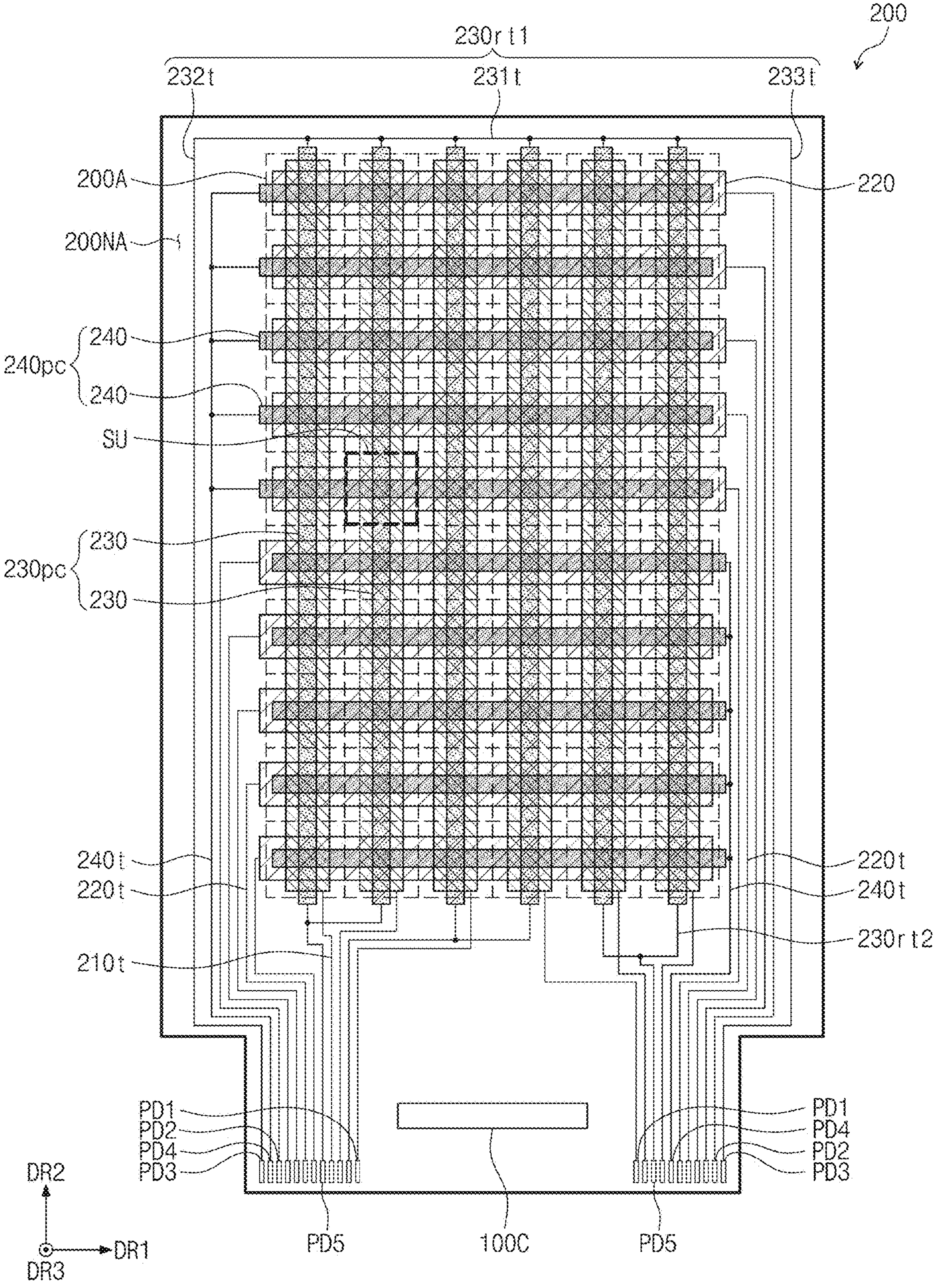
FIG. 8 is a plan view of a sensor layer according to one or more embodiments of the present disclosure.

FIG. 8 is a plan view of the sensor layer 200 according to one or more embodiments of the present disclosure.

Referring to FIG. 8, a sensing area 200A, and a peripheral area 200NA that is adjacent to the sensing area 200A, may be defined in the sensor layer 200.

The sensor layer 200 may include a plurality of first electrodes 210, a plurality of second electrodes 220, a plurality of third electrodes 230, and a plurality of fourth electrodes 240, which are located in the sensing area 200A.

The first electrodes 210 may cross the second electrodes 220. Each of the first electrodes 210 may extend in the second direction DR2, and the first electrodes 210 may be arranged to be spaced apart from each other in the first direction DR1. Each of the second electrodes 220 may extend along the first direction DR1, and the second electrodes 220 may be arranged to be spaced apart from each other in the second direction DR2. A sensing unit SU of the sensor layer 200 may be an area, in which one first electrode 210 and one second electrode 220 cross each other.

FIG. 8 illustrates six first electrodes 210 and ten second electrodes 220, by way of example, and illustrates sixty sensing units SU, by way of example, but, the number of the first electrodes 210 and the number of the second electrodes 220 are not limited thereto.

Each of the third electrodes 230 may extend along the second direction DR2, and the third electrodes 230 may be arranged to be spaced apart from each other in the first direction DR1. One third electrode 230 may at least partially overlap one first electrode 210. According to one or more embodiments of the present disclosure, a capacitance (or a coupling capacitance) between one first electrode 210 and one third electrode 230 may be adjusted by adjusting an overlapping area of one first electrode 210 and one third electrode 230.

In one or more embodiments of the present disclosure, at least some of the third electrodes 230 may be connected to each other in parallel. For example, FIG. 8 illustrates an example of two third electrodes 230 being connected to each other in parallel to constitute a first electrode group 230*pc*, and three first electrode groups 230*pc* may be arranged along the first direction DR1. However, the number of the third electrodes 230 that constitute the first electrode group 230*pc* is not limited thereto. For example, one first electrode group 230*pc* may include only one third electrode 230, or may include the three or more third electrodes 230.

As the number of the third electrodes 230 that are included in the first electrode group 230*pc* and are connected to each other in parallel increases, a resistance of the first electrode group 230*pc* is lowered, and thus, power efficiency may be improved and sensing sensitivity may be improved. On the other hand, as the number of third electrodes 230 that are included in the first electrode group 230*pc* decreases, a loop coil pattern that is formed by using the first electrode group 230*pc* may be implemented in more various forms.

The fourth electrodes 240 may be arranged along the second direction DR2, and the fourth electrodes 240 may extend along the first direction DR1. One fourth electrode 240 may at least partially overlap one second electrode 220. According to one or more embodiments of the present disclosure, a capacitance (or a coupling capacitance) between one second electrode 220 and one fourth electrode 240 may be adjusted by adjusting an overlapping extent of one second electrode 220 and one fourth electrode 240.

In one or more embodiments of the present disclosure, at least some of the fourth electrodes 240 may be electrically connected to each other to constitute one second electrode group 240*pc*. For example, FIG. 8 illustrates as an example that five fourth electrodes 240 are connected to the same trace line (e.g., an auxiliary trace line 240*t*) to constitute one second electrode group 240*pc*. Accordingly, FIG. 8 illustrates that two second electrode groups 240*pc* are arranged along the second direction DR2. However, the number of fourth electrodes 240 that constitute one second electrode group 240*pc* is not limited thereto. For example, the number of fourth electrodes 240 that constitute one second electrode group 240*pc* may be ten, and in this case, the sensor layer 200 may include only the one second electrode group 240*pc*.

The sensor layer 200 may further include a plurality of first trace lines 240*t* that is located in a peripheral area 200NA, a plurality of first pads PD1 that are connected to the first trace lines 210*t* in one-to-one correspondence, a plurality of second trace lines 220*t*, and a plurality of second pads PD2 that are connected to the second trace lines 220*t* in one-to-one correspondence. The first trace lines 240*t* may be electrically connected to the first electrodes 210 in one-to-one correspondence. The second trace lines 220*t* may be electrically connected to the second electrodes 220 in one-to-one correspondence.

The sensor layer 200 may include a first loop trace line 230*rt*1 that is located in the peripheral area 200NA, a plurality of third pads PD3 that are connected to one end and an opposite end of the first loop trace line 230*rt*1, auxiliary trace lines 240*t*, fourth pads PD4 that are electrically connected to the auxiliary trace lines 240*t* in one-to-one correspondence, second loop trace lines 230*rt*2, and a fifth pad PD5 that is connected to the second loop trace lines 230*rt*2 in one-to-one correspondence. The first loop trace line 230*rt*1 may be referred to as loop trace lines, the second loop trace lines 230*rt*2 may be referred to as third trace lines, and the auxiliary trace lines 240*t* may be referred to as fourth trace lines.

In one or more embodiments of the present disclosure, the first loop trace line 230*rt*1 may be electrically connected to the third electrodes 230. That is, the first loop trace line 230*rt*1 may be electrically connected to most or all of the third electrodes 230. The third electrodes 230 may be referred to as charging electrodes.

The first loop trace line 230*rt* 1 may include a first line portion 231*t* that extends along the first direction DR1 and is electrically connected to the third electrodes 230, a second line portion 232*t* that extends from a first end of the first line portion 231*t* along the second direction DR2, and a third line portion 233*t* that extends from a second end of the first line portion 231*t* along the second direction DR2.

Each of the second line portion 232*t* and the third line portion 233*t* may extend in the same direction as an extension direction of the third electrodes 230, for example, in the second direction DR2. Each of the second line portion 232*t* and the third line portion 233*t* may serve as the first electrode group 230*pc*, and may obtain the same effect that the third electrodes 230 are also located in the peripheral area 200NA. For example, any one of the second line portion 232*t* and the third line portion 233*t* and any one of the third electrodes 230 may form a coil. Accordingly, a pen that is located in an area that is adjacent to the peripheral area 200NA may also be sufficiently charged by a loop including the second line portion 232*t* or the third line portion 233*t*.

In one or more embodiments of the present disclosure, to adjust a resistance of the second line portion 232*t* and a resistance of the third line portion 233*t*, a position and a width of each of the second line portion 232*t* and the third line portion 233*t* in the first direction DR1 may be adjusted. In this case, the pen may be sufficiently charged through a current path including the second line portion 232*t* or the third line portion 233*t*. As a result, a pen-charging performance of the electronic device 1000 (see FIG. 2A) may be improved. That is, as a charging rate of the pen is improved, a signal-to-noise ratio of a signal that is provided from the pen may increase. Accordingly, a linearity and an accuracy with respect to a pen input may be improved.

The second loop trace lines 230*rt*2 may be connected to the first electrode groups 230*pc* in one-to-one correspondence. That is, the number of the second loop trace lines 230*rt*2 may correspond to the number of the first electrode groups 230*pc*. FIG. 8 illustrates three second loop trace lines 230*rt*2 and three first electrode groups 230*pc*, by way of example.

The auxiliary trace lines 240*t* may be spaced apart from each other with the sensing area 200A interposed therebetween. The auxiliary trace lines 240*t* may be electrically connected to the second electrode groups 240*pc* in one-to-one correspondence. FIG. 7 illustrates that two second electrode groups 240*pc* are arranged as an example. The auxiliary trace line 240*t* connected to one second electrode group 240*pc*, and the auxiliary trace line 240*t* connected to another second electrode group 240*pc* may be spaced apart from each other with the sensing area 200A interposed therebetween. However, the present disclosure is not particularly limited thereto. The auxiliary trace lines 240*t* may be referred to as trace lines.

Figure 9A:
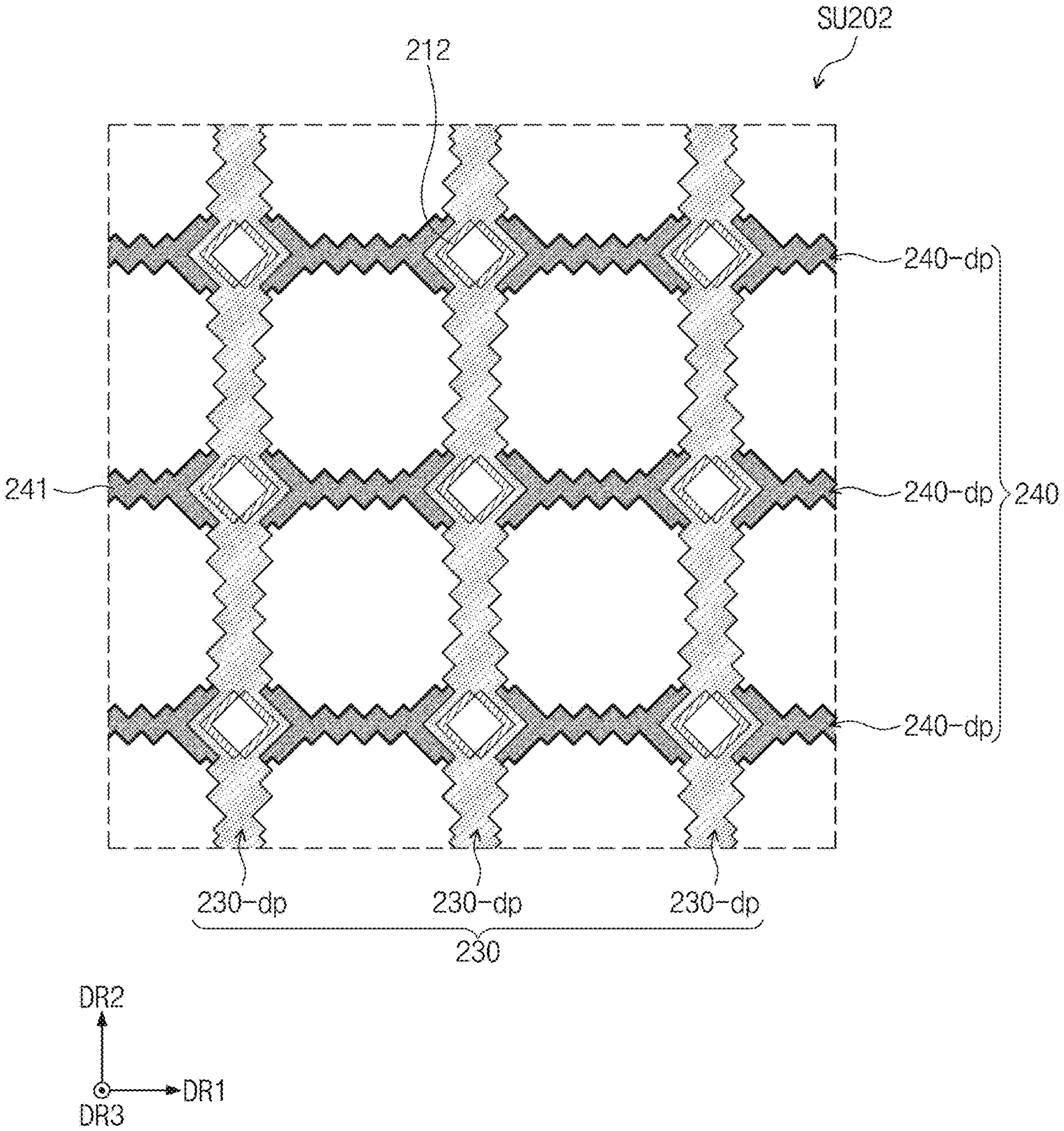
FIG. 9A is a plan view illustrating a first conductive layer of a sensing unit according to one or more embodiments of the present disclosure.
Figure 9B:
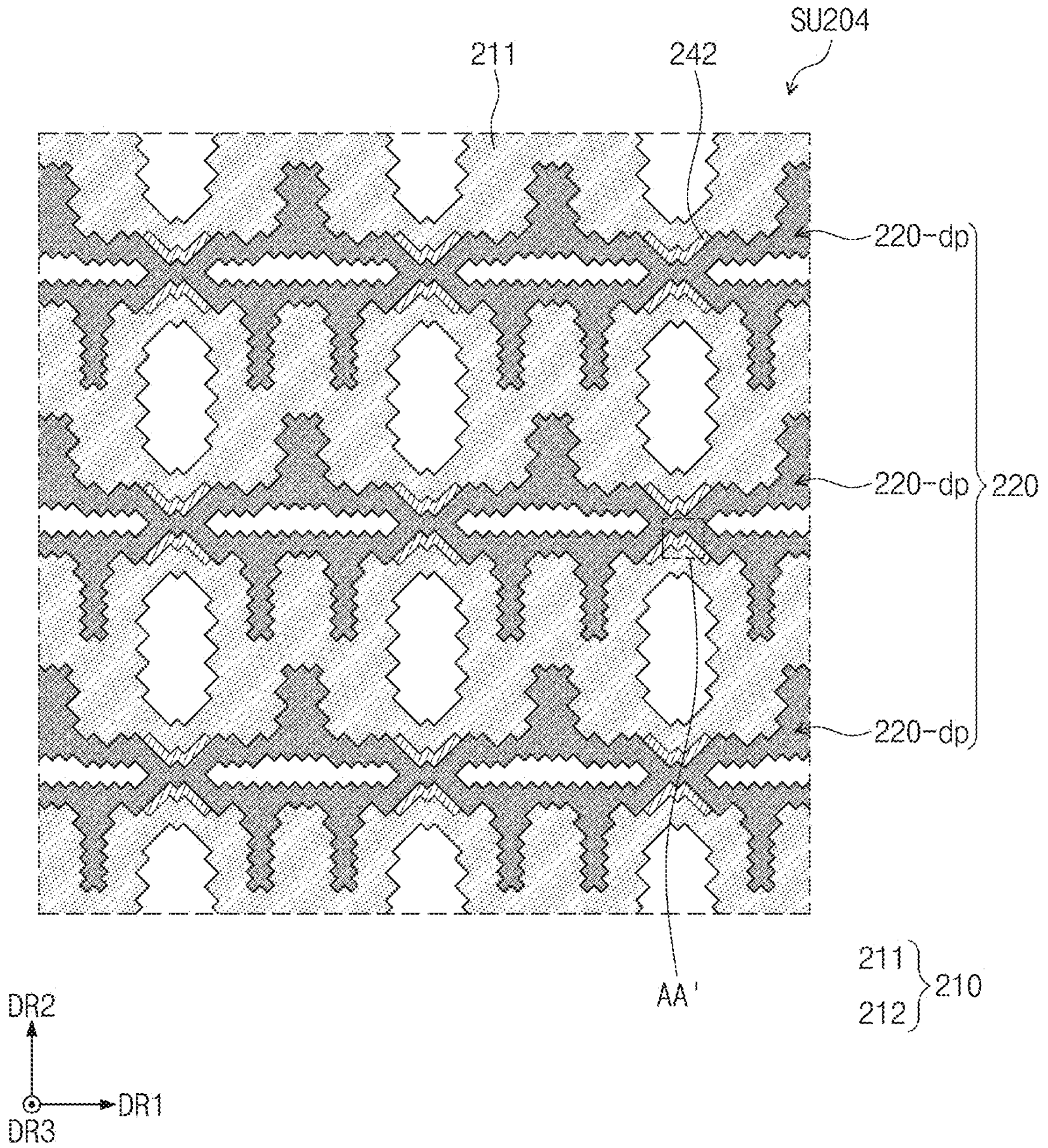
FIG. 9B is a plan view showing a second conductive layer of a sensing unit according to one or more embodiments of the present disclosure.
Figure 10:
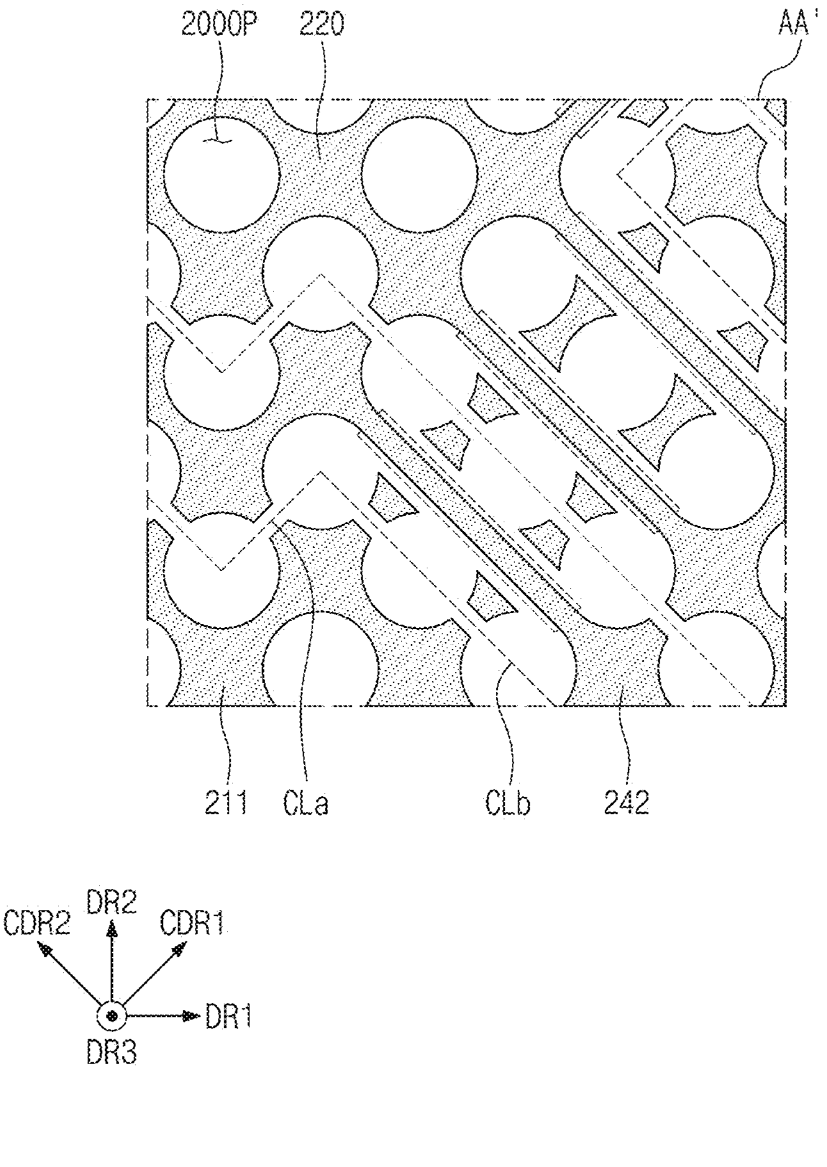
FIG. 10 is an enlarged plan view of area AA' illustrated in FIG. 9B.

FIG. 9A is a plan view showing a first conductive layer SU202 of a sensing unit SU (see FIG. 8) according to one or more embodiments of the present disclosure. FIG. 9B is a plan view illustrating a second conductive layer SU204 of the sensing unit SU (see FIG. 8) according to one or more embodiments of the present disclosure. FIG. 10 is an enlarged plan view of area AA' illustrated in FIG. 9B.

In FIGS. 9A and 9B, the shape of the mesh structure is not illustrated, but boundaries of the components are briefly illustrated as lines. That is, the lines illustrated in FIGS. 9A and 9B may be understood as corresponding to the lines, along which the mesh structure illustrated in FIG. 10 is removed, and lines CLa and CLb are illustrated by dotted lines in FIG. 10.

The shape and mesh structure of the sensing unit SU illustrated in FIGS. 9A, 9B, and 10 are only examples, and the present disclosure is not limited thereto. The shape and mesh structure of the sensing unit SU may be variously modified.

Referring to FIGS. 9A and 9B, the first electrode 210 may include a plurality of first patterns 211, and a plurality of first bridge patterns 212 that are electrically connected to the first patterns 211. The first patterns 211 that are arranged to be spaced apart from each other in the second direction DR2 may be electrically connected by the first bridge patterns 212. The first patterns 211 may be included in the second conductive layer SU204, and the first bridge patterns 212 may be included in the first conductive layer SU202.

Two first patterns 211 that are adjacent to each other in the second direction DR2 in one first electrode 210 may be electrically connected to each other by six first bridge patterns 212. An increase in the number of the first bridge patterns 212 arranged in the first direction DR1 that crosses the second direction DR2 that is an extension direction of the first electrode 210 may correspond to an increase in the number of signal paths. Accordingly, as the number of the signal paths increases, the resistance of the first electrode 210 may decrease. As a result, the sensing sensitivity of the sensor layer 200 may be improved.

The second electrode 220 may include a plurality of first division electrodes 220-*dp* that are spaced apart from each other in the second direction DR2. Each of the first division electrodes 220-*dp* may extend in the first direction DR1, and the first division electrodes 220-*dp* may be spaced apart from each other in the second direction DR2. The first division electrodes 220-*dp* may be included in the second conductive layer SU204. Three first division electrodes 220-*dp* included in one second electrode 220 may be connected to one second trace line 220*t* (see FIG. 8).

The third electrode 230 may include a plurality of second division electrodes 230-*dp* that are spaced apart from each other in the first direction DR1. Each of the second division electrodes 230-*dp* may extend along the second direction DR2. The second division electrodes 230-*dp* may be spaced apart from each other in the first direction DR1. When viewed in the third direction DR3, the second division electrodes 230-*dp* may at least partially overlap the first patterns 211.

Referring to FIGS. 8 and 9A together, one second loop trace line 230*rt*2 is electrically connected to one first electrode group 230*pc*. One first electrode group 230*pc* may include two third electrodes 230. In this case, one second loop trace line 230*rt*2 may be electrically connected to six second division electrodes 230-*dp*. In this case, a degree, to which the number of pads increases in the sensor layer 200, may decrease.

The fourth electrode 240 may include a plurality of third division electrodes 240-*dp* that are spaced apart from each other in the second direction DR2. Each of the third division electrodes 240-*dp* may extend along the first direction DR1. Each of the third division electrodes 240-*dp* may include a plurality of second patterns 241, and a plurality of second bridge patterns 242 that are electrically connected to the second patterns 241. The second patterns 241 and the second bridge patterns 242 may be electrically connected to each other through contact holes defined in the intermediate insulating layer 203 (see FIG. 7A). Two adjacent second patterns 241 may be spaced apart from each other with one second division electrode 230-*dp* and two first bridge patterns 212 interposed therebetween.

In FIGS. 9A and 9B, it is illustrated as an example that three first division electrodes 220-*dp*, three second division electrodes 230-*dp*, and three third division electrodes 240-*dp* are included in one sensing unit SU, but the present disclosure is not particularly limited thereto. For example, each of the number of first division electrodes 220-*dp*, the number of second division electrodes 230-*dp*, and the number of third division electrodes 240-*dp* included in one sensing unit SU may be one, two, or four or more.

In one or more embodiments of the present disclosure, a first capacitor may be defined between the first electrode 210 and the third electrode 230, and a second capacitor may be defined between the second electrode 220 and the fourth electrode 240. A first capacitance of the first capacitor and a second capacitance of the second capacitor may be adjusted by an overlapping extent between the first electrode 210 and the third electrode 230 and an overlapping extent between the second electrode 220 and the fourth electrode 240.

As the first and second capacitances increase, an amount of induction current that is transferred from the third electrode 230 to the first electrode 210 may increase, and an amount of induction current that is transferred from the fourth electrode 240 to the second electrode 220 may increase. Accordingly, as the first and second capacitances increase, a pen-sensing performance of the sensor layer 200 may be improved. Furthermore, the first and second capacitances may function as loads during touch sensing. Accordingly, as the first and second capacitances decrease, touch-sensing performance may be improved.

In one or more embodiments of the present disclosure, the overlapping extent between the first electrode 210 and the third electrode 230 and the overlapping extent between the second electrode 220 and the fourth electrode 240 may be suitably adjusted. Accordingly, the sensor layer 200 having appropriate levels of capacitance in consideration of touch sensitivity and pen-sensing sensitivity may be provided. As a result, an electronic device 1000 (see FIG. 2A) having improved pen sensitivity and touch sensitivity may be provided.

In one or more embodiments of the present disclosure, an extent occupied by the components included in the first electrode 210 and the second electrode 220 in the second conductive layer SU204 in one sensing unit SU may be larger than an extent occupied by the components included in the third electrode 230 and the fourth electrode 240. A change in capacitance due to the first input 2000 (see FIG. 6) may be greater as a distance becomes shorter. Accordingly, components for sensing the first input 2000 (see FIG. 6) may be arranged in a layer that is adjacent to the surface of the electronic device 1000 (see FIG. 1A) to have a relatively great extent. As a result, touch performance may be improved.

Referring to FIGS. 9A, 9B, and 10, each of the first to fourth electrodes 210, 220, 230, and 240 may have a mesh structure. The mesh structure may be a structure, in which a plurality of openings 200OP are defined. In FIG. 10, a circular shape, in which each of the plurality of openings 200OP has a corresponding curvature, is illustrated as an example, but the present disclosure is not particularly limited thereto. For example, each of the openings 200OP may be modified into various shapes, such as a square shape, a polygonal shape, or an atypical shape.

In FIG. 10, portions of the first pattern 211, the second bridge pattern 242, and the second electrode 220 located on the second conductive layer SU204 are illustrated. The first pattern 211, the second bridge pattern 242, and the second electrode 220 may be electrically insulated from each other. For example, the first pattern 211, the second bridge pattern 242, and the second electrode 220 may be electrically insulated from each other by a first line CLa that extends along a first crossing direction CDR1 that crosses the first direction DR1 and the second direction DR2, and a second line CLb that extends along a second crossing direction CDR2 that crosses the first crossing direction CDR1. A portion and another portion of the conductive layer may be spaced apart from each other with the first line CLa and the second line CLb interposed therebetween.

Figure 11:
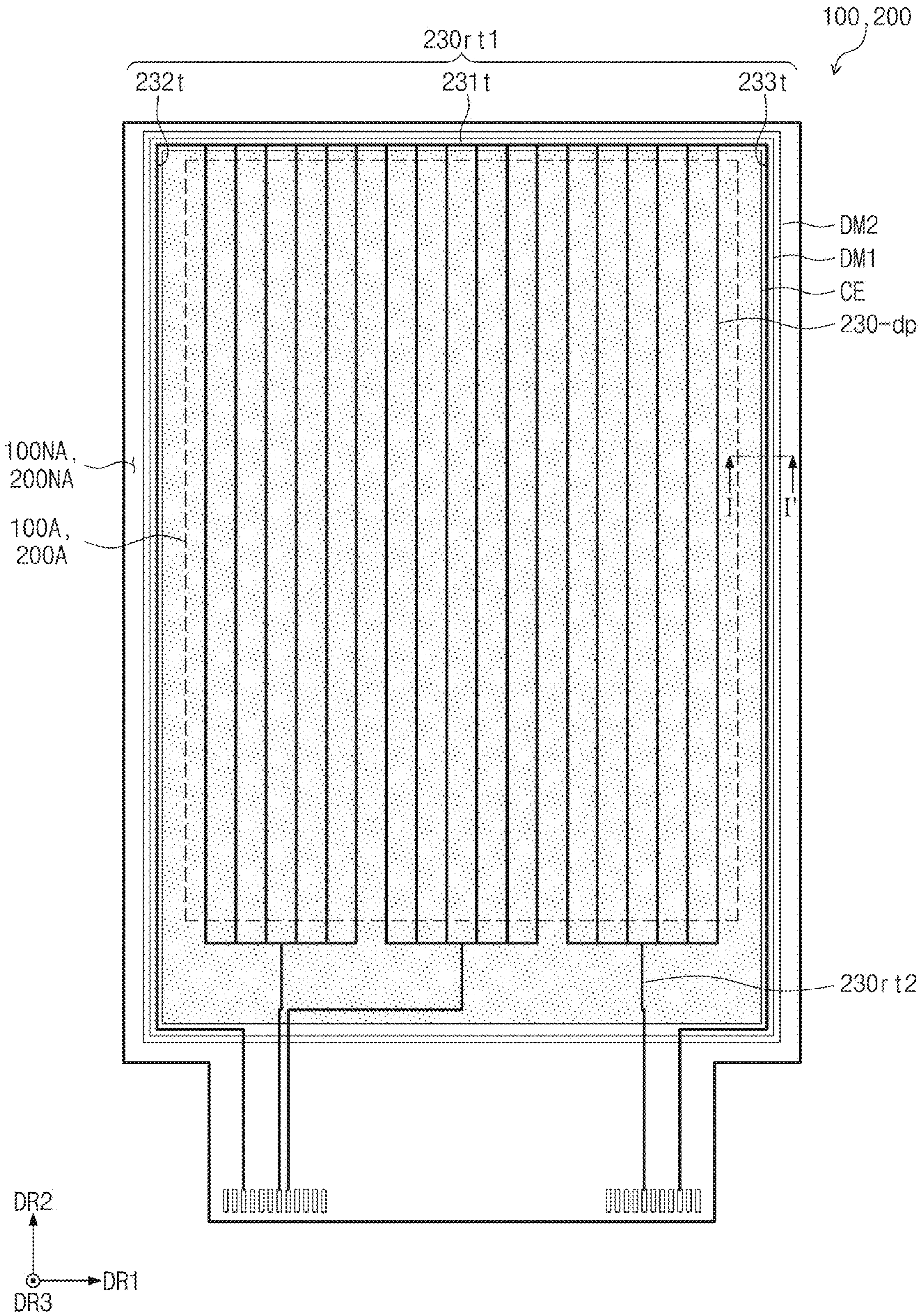
FIG. 11 is a plan view illustrating some components of a display layer and some components of a sensor layer according to one or more embodiments of the present disclosure.

FIG. 11 is a plan view illustrating some components of a display layer 100 and some components of a sensor layer 200 according to one or more embodiments of the present disclosure.

Referring to FIG. 11, the display layer 100 may include at least one dam part DM1 and DM2 that is located in the non-display area 100NA. The at least one dam part DM1 and DM2 may include a first dam part DM1 and a second dam part DM2. Each of the first dam part DM1 and the second dam part DM2 may have a shape that surrounds the display area 100A. In one or more embodiments of the present disclosure, the second dam part DM2 may be omitted, or an additional dam part may be further located.

In FIG. 11, a second electrode CE (hereinafter referred to as a common electrode) of the display layer 100, the first dam part DM1, and the second dam part DM2 are illustrated. Each of the first dam part DM1 and the second dam part DM2 may have a closed loop shape that surrounds a common electrode CE (as used herein "surrounds" may correspond to surrounding "in plan view").

In FIG. 11, the second division electrodes 230-*dp*, the first loop trace line 230*rt*1, and the second loop trace line 230*rt*2 of the sensor layer 200 are illustrated. The second division electrodes 230-*dp* are schematically illustrated as the form of lines.

According to one or more embodiments of the present disclosure, when viewed on a plane, the common electrode CE may be located between the second line portion 232*t* and the third line portion 233*t* (as used herein, "between" may correspond to being between in plan view). The second line portion 232*t* and the third line portion 233*t* of the first loop trace line 230*rt*1 may not overlap the common electrode CE (e.g., may be spaced from the common electrode CE in plan view). In this case, because an area, in which the second line portion 232*t* and the third line portion 233*t* are located, is not limited to an area that overlaps the common electrode CE, a degree of freedom in width design may be improved. For example, a width of each of the second line portion 232*t* and/or the third line portion 233*t* may be increased to decrease a resistance of each of the second line portion 232*t* and/or the third line portion 233*t*.

Furthermore, the width of each of the second line portion 232*t* and the third line portion 233*t* may be adjusted such that a difference between the resistance of each of the second line portion 232*t* and the third line portion 233*t*, and the resistance of the first electrode group 230*pc* (see FIG. 8), is reduced or minimized. Accordingly, the pen may be sufficiently charged through a current path including the second line portion 232*t* or the third line portion 233*t*. As a result, a pen-charging performance of the electronic device 1000 (see FIG. 2A) may be improved. That is, as a charging rate of the pen is improved, a signal-to-noise ratio of a signal that is provided from the pen may increase. Accordingly, a linearity and an accuracy with respect to a pen input may be improved.

Furthermore, because the second line portion 232*t* and the third line portion 233*t* do not overlap the common electrode CE, the width of the second trace lines 220*t* (see FIG. 8) and the auxiliary trace lines 240*t* (see FIG. 8) located to overlap the common electrode CE may be additionally adjusted. Accordingly, the resistance of each of the second trace lines 220*t* and the auxiliary trace lines 240*t* may also be reduced.

Referring to FIG. 8 together, the resistance of the longest one of the first trace lines 210*t* may be about 138 ohms, the resistance of the longest one of the second trace lines 220*t*, may be about 439 ohms, the resistance of the second line portion 232*t* may be about 80 ohms, the resistance of the third line portion 233*t* may be about 80 ohms, and the resistance of the longest one of the second loop trace lines 230*rt*2, may be about 139 ohms. The resistance of the longest one of the auxiliary trace lines 240*t* may be about 151 ohms.

Each of the resistors may mean a resistance from a point, at which the trace line and the electrode are connected to each other, to a pad that is connected to the trace line. Furthermore, a resistance of each of the second line portion 232*t* and the third line portion 233*t* may mean a resistance from a point that is connected to the first line portion 231*t* to the pad. Furthermore, the resistances are only examples, and the resistance of each trace line is not limited to the above-described example.

Unlike one or more embodiments of the present disclosure, when the second line portion 232*t* and the third line portion 233*t* are located in an area that overlaps the common electrode CE, the resistance of each of the second line portion 232*t* and the third line portion 233*t* may increase to about 305 ohms, and the resistance of the auxiliary trace line 240*t* may increase to about 300 ohms. That is, as the second line portion 232*t* and the third line portion 233*t* are located in an area that does not overlap the common electrode CE, the resistance of each of the second line portion 232*t* and the third line portion 233*t* may decrease from about 305 ohms to about 80 ohms. Furthermore, the resistance of the auxiliary trace line 240*t* may be decreased from about 300 ohms to about 151 ohms by adjusting the width of the auxiliary trace line 240*t*.

According to one or more embodiments of the present disclosure, as the positions of the second line portion 232*t* and the third line portion 233*t* is designed to be located in an area that does not overlap the common electrode CE, the resistances of not only the second line portion 232*t* and the third line portion 233*t*, but also the resistance of the second trace lines 220*t* or the auxiliary trace line 240*t*, may be further lowered. As the resistance of each trace line decreases, distortion or noise may decrease when a signal is transmitted through the trace line.

Figure 12:
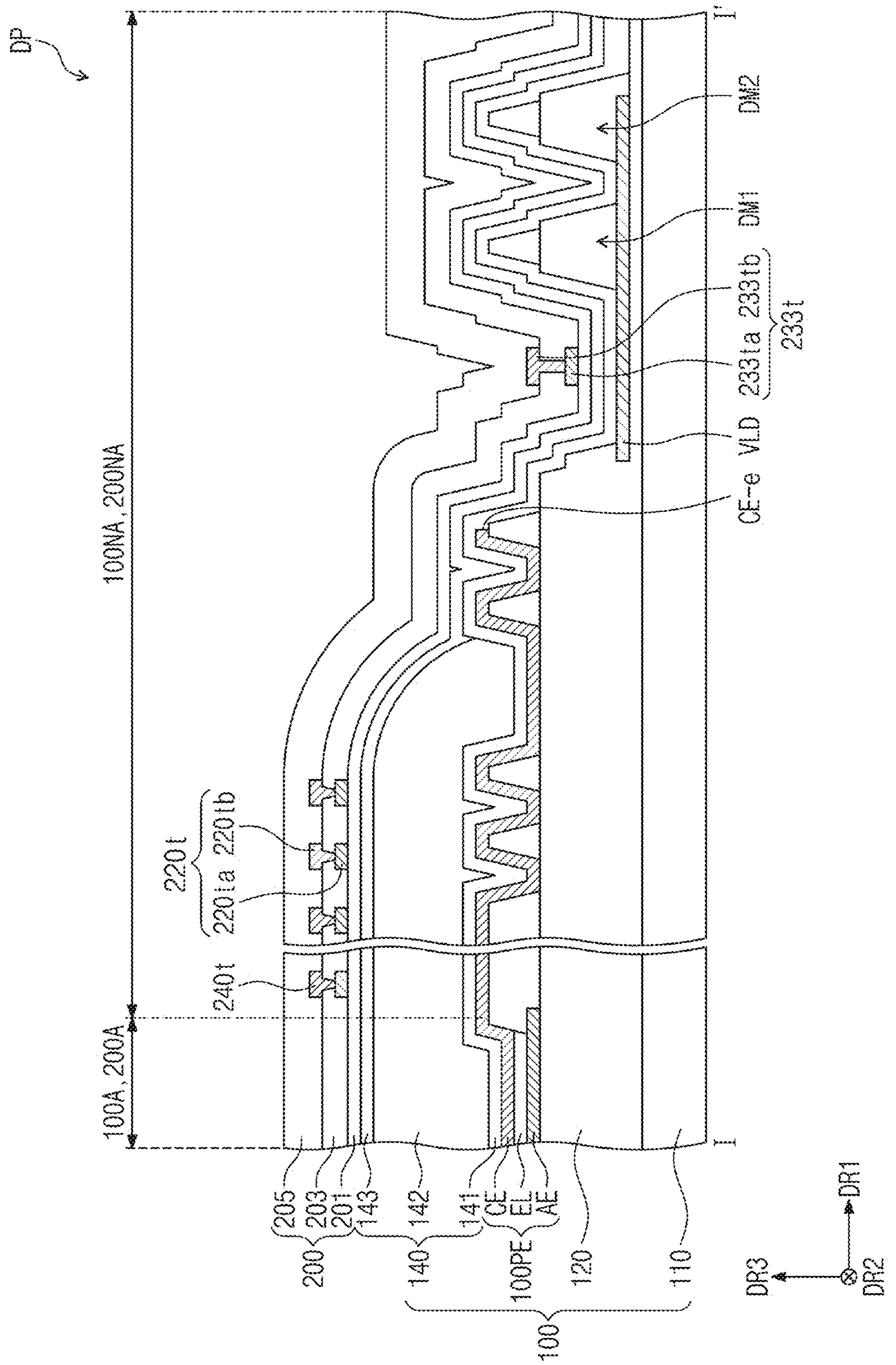
FIG. 12 is a cross-sectional view taken along the line I-I' illustrated in FIG. 11 according to one or more embodiments of the present disclosure.

FIG. 12 is a cross-sectional view taken along the line I-I' illustrated in FIG. 11 according to one or more embodiments of the present disclosure.

Referring to FIGS. 11 and 12, the third line portion 233*t* may be located between an end CE-e of the common electrode CE and the first dam part DM1. Although the second line portion 232*t* is not illustrated in FIG. 12, a portion, at which the second line portion 232*t* is located, may have a shape that is similar to a shape that is symmetrical to each other (e.g., both leftwards and rightwards with respect to the drawing illustrated). That is, the second line portion 232*t* may be located between the left end CE-e of the common electrode CE and the first dam part DM1. Hereinafter, the third line portion 233*t* will be described in detail, and the contents thereof may also be applied to the second line portion 232*t*.

Each of the second trace lines 220*t* may include a first layer line 220*ta*, and a second layer line 220*tb* that is located on the first layer line 220*ta*. The second layer line 220*tb* of the second trace line 220*t* may pass through a contact hole provided in the intermediate insulating layer 203 to be electrically connected to the first layer line 220*ta* of the second trace line 220*t*.

The third line portion 233*t* may include a first layer line 233*ta*, and a second layer line 233*tb* that is located on the first layer line 233*ta*. The second layer line 233*tb* of the third line portion 233*t* may pass through a contact hole provided in the intermediate insulating layer 203 to be electrically connected to the first layer line 233*ta* of the third line portion 233*t*.

The first layer line 220*ta* of each of the second trace lines 220*t* may be located at the same layer as the first layer line 233*ta* of the third line portion 233*t*. The second layer line 220*tb* of each of the second trace lines 220*t* may be located at the same layer as the second layer line 233*tb* of the third line portion 233*t*.

In one or more embodiments of the present disclosure, the first layer line 233*ta* and the second layer line 233*tb* may not overlap (e.g., may be separated from, in plan view) the first dam part DM1 and the second dam part DM2. That is, each of the second line portion 232*t* and the third line portion 233*t* may be located in an area between the common electrode CE and the first dam part DM1.

As each of the second line portion 232*t* and the third line portion 233*t* is located in an area that does not overlap the common electrode CE, an extent, in which the second trace lines 220*t* and the auxiliary trace line 240*t* may be located, may be further secured. Accordingly, the resistance of each of the second trace lines 220*t* and the auxiliary trace line 240*t* may be decreased by increasing the width of each of the second trace lines 220*t* and the auxiliary trace line 240*t*. Although FIG. 12 illustrates that the widths of the second trace lines 220*t* and the auxiliary trace line 240*t* are the same, the width of the auxiliary trace line 240*t* may be greater than the width of each of the second trace lines 220*t*.

The encapsulation layer 140 may include a first inorganic encapsulation layer 141 that covers the light-emitting element 100PE, an organic encapsulation layer 142 that is located on the first inorganic encapsulation layer 141, and a second inorganic encapsulation layer 143 that is located on the organic encapsulation layer 142 to cover the organic encapsulation layer 142.

In one or more embodiments of the present disclosure, the second trace lines 220*t* and the auxiliary trace line 240*t* are located to overlap the organic encapsulation layer 142 and the common electrode CE, and the second line portion 232*t* and the third line portion 233*t* may not overlap the organic encapsulation layer 142.

Noise that is caused in the second trace lines 220*t* and the auxiliary trace line 240*t* through driving of the display layer 100 may be shielded by the common electrode CE, to which a constant voltage is provided. Additionally, because the second trace lines 220*t* and the auxiliary trace line 240*t* are separated from the circuit layer 120 of the display layer 100 by a corresponding distance or more by the organic encapsulation layer 142, an influence on noise may be further reduced.

The second line portion 232*t* and the third line portion 233*t* do not overlap the common electrode CE. A driving circuit, for example, a transistor or the like may not be located in a partial area of the circuit layer 120, which overlaps an area, in which the second line portion 232*t* and the third line portion 233*t* are located. Accordingly, even though the display layer 100 is driven, noise may not be generated in the second line portion 232*t* and the third line portion 233*t*.

The circuit layer 120 may further include a power line VLD. The power line VLD may be located at the same layer as the first connection electrode CNE1 described in FIG. 7A, or may be located at the same layer as the second connection electrode CNE2.

According to one or more embodiments of the present disclosure, the power line VLD may overlap or at least partially overlap the second line portion 232*t* and the third line portion 233*t*. Furthermore, the power line VLD may at least partially overlap the first dam part DM1 and the second dam part DM2. A constant voltage that is substantially the same as a voltage provided to the common electrode CE may be provided to the power line VLD. Accordingly, even when noise is caused in the second line portion 232*t* and the third line portion 233*t* from the display layer 100, the noise may be shielded by the power line VLD.

Each of the first dam part DM1 and the second dam part DM2 may include a portion of a layer included in the circuit layer 120 and a portion of a layer included in the light-emitting element layer 130. For example, each of the first dam part DM1 and the second dam part DM2 may include at least a portion of the fifth insulating layer 50, the sixth insulating layer 60, and the pixel definition film 70 illustrated in FIG. 7A.

Figure 13:
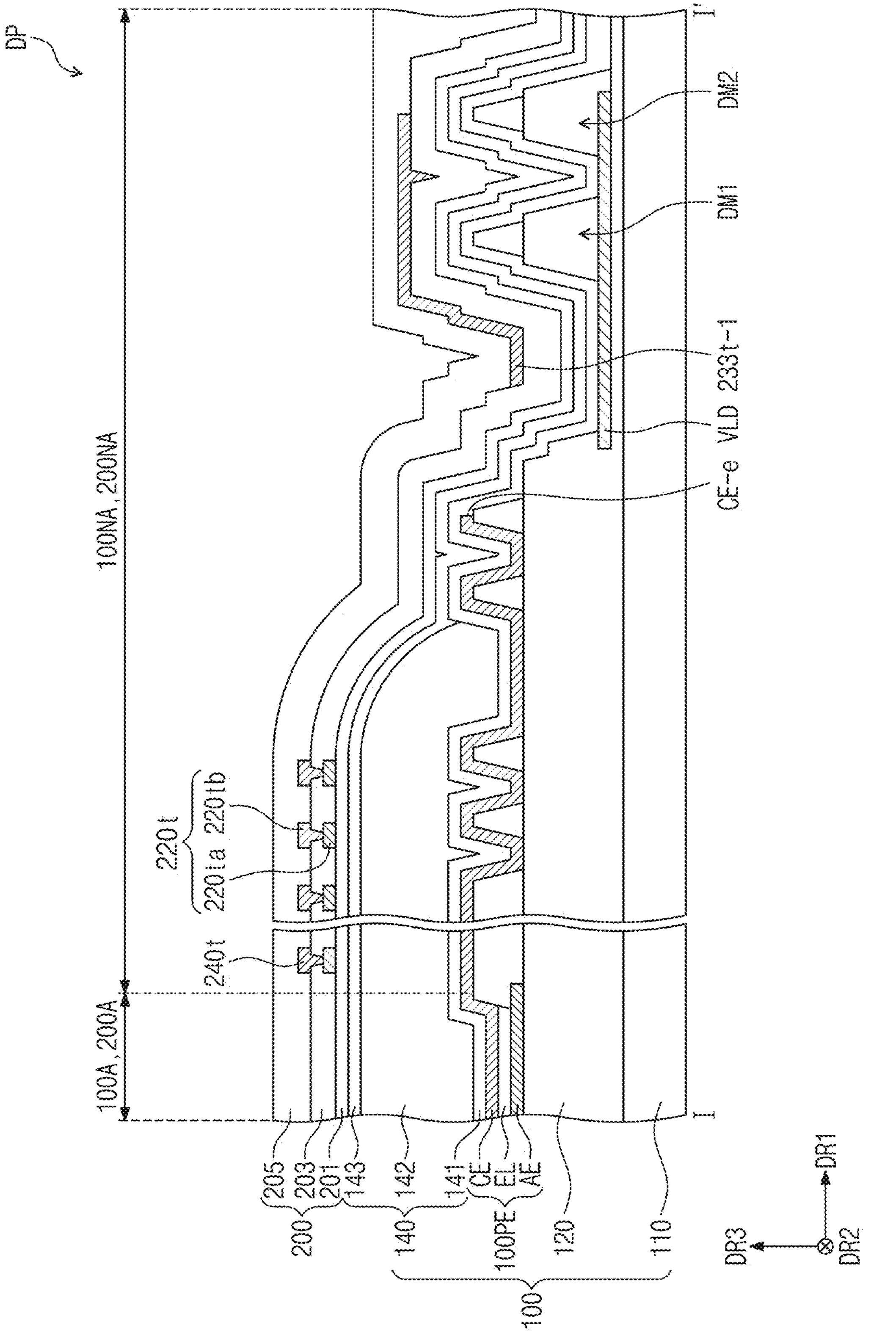
FIG. 13 is a cross-sectional view taken along the line I-I' illustrated in FIG. 11 according to one or more embodiments of the present disclosure.

FIG. 13 is a cross-sectional view taken along the line I-I' illustrated in FIG. 11 according to one or more embodiments of the present disclosure.

Referring to FIGS. 11 and 13, the third line portion 233*t*-1 may overlap the first dam part DM1. A width of the third line portion 233*t*-1 in the first direction DR1 may be greater than a width of the third line portion 233*t* described above with reference to FIG. 12 in the first direction DR1.

Each of the second trace lines 220*t* may include a first layer line 220*ta*, and a second layer line 220*tb* that is located on the first layer line 220*ta*. The third line portion 233*t*-1 may be located at the same layer as the second layer line 220*tb*.

The third line portion 233*t*-1 may overlap the first dam part DM1 with the intermediate insulating layer 203 interposed therebetween. That is, the bending, or step, due to the protruding shape of the first dam part DM1 may be mitigated (e.g., planarized) by the intermediate insulating layer 203. Accordingly, because the third line portion 233*t*-1 is formed on a more planarized surface, a reliability of the third line portion 233*t*-1 may be improved.

Figure 14:
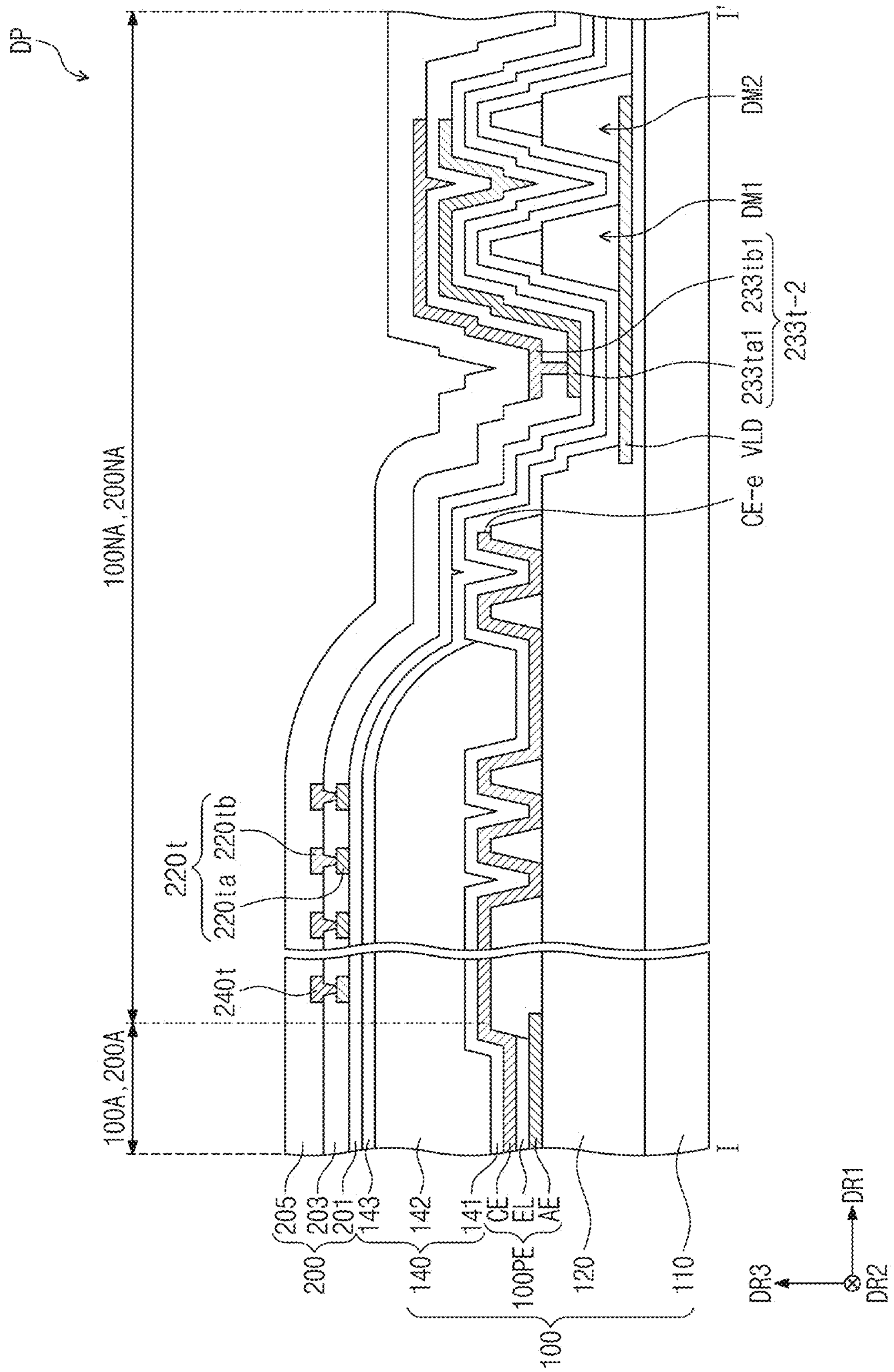
FIG. 14 is a cross-sectional view taken along the line I-I' illustrated in FIG. 11 according to one or more embodiments of the present disclosure.

FIG. 14 is a cross-sectional view taken along the line I-I' illustrated in FIG. 11 according to one or more embodiments of the present disclosure.

Referring to FIGS. 11 and 14, the third line portion 233*t*-2 may overlap the first dam part DM1. A width of the third line portion 233*t*-2 in the first direction DR1 may be greater than a width of the third line portion 233*t*-2 described above with reference to FIG. 12 in the first direction DR1.

The third line portion 233*t*-2 may include a first layer line 233*ta*1, and a second layer line 233*tb*1 that is located on the first layer line 233*ta*1. The second layer line 233*tb*1 of the third line portion 233*t*-2 may pass through a contact hole provided in the intermediate insulating layer 203 to be electrically connected to the first layer line 233*ta*1 of the third line portion 233*t*. Both the first layer line 233*ta*1 and the second layer line 233*tb*1 may overlap the first dam part DM1.

In one or more embodiments of the present disclosure, each of the second trace lines 220*t*, the auxiliary trace line 240*t*, and the third line portion 233*t*-2 may have a solid structure. For example, an opening may not be defined in the second trace lines 220*t*, the auxiliary trace line 240*t*, and the third line portion 233*t*. However, this is only an example, and the present disclosure is not particularly limited thereto. For example, the third line portion 233*t*-2 may have a mesh structure, in which an opening is defined.

Figure 15:
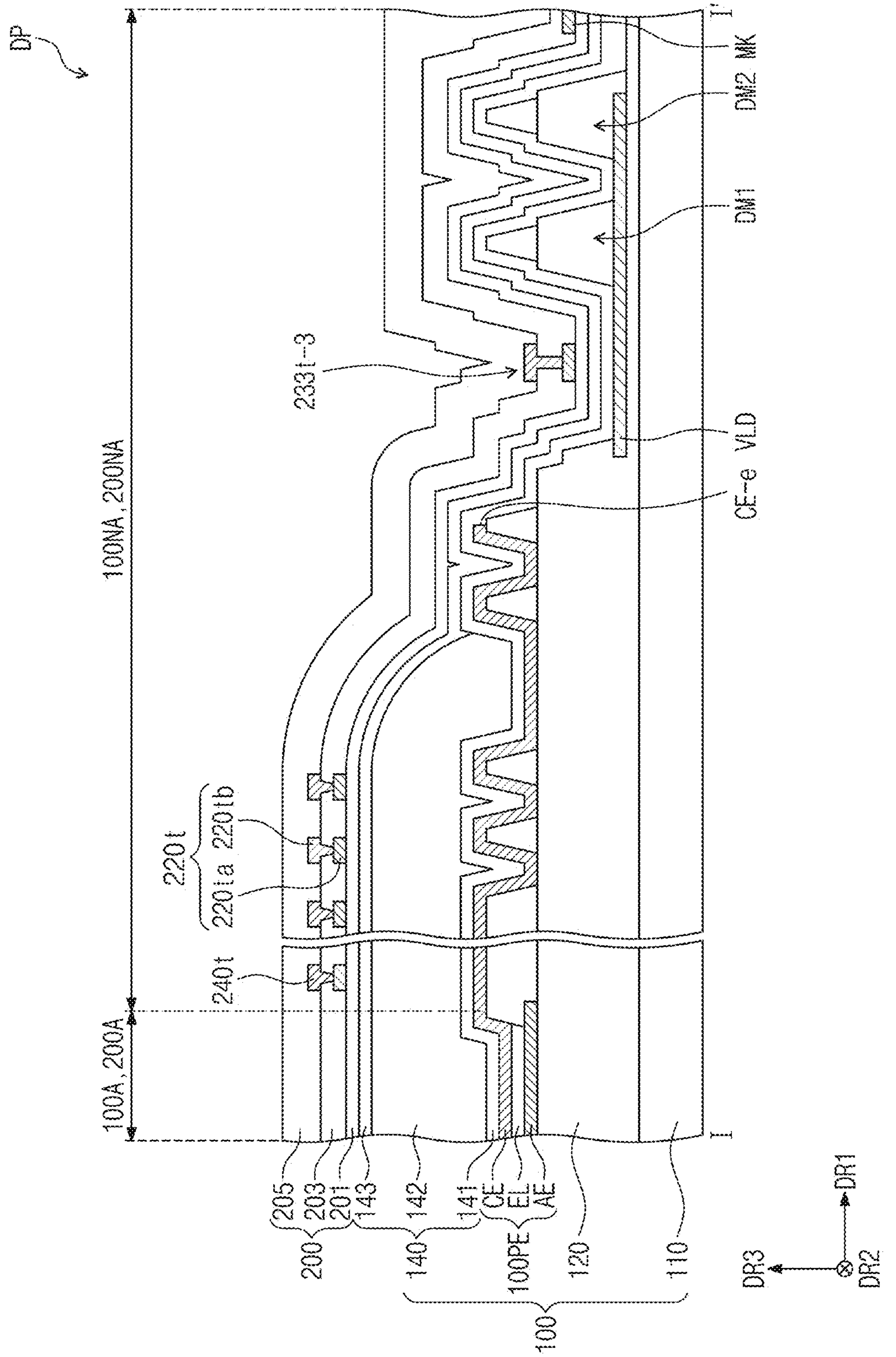
FIG. 15 is a cross-sectional view taken along the line I-I' illustrated in FIG. 11 according to one or more embodiments of the present disclosure.
Figure 16A:
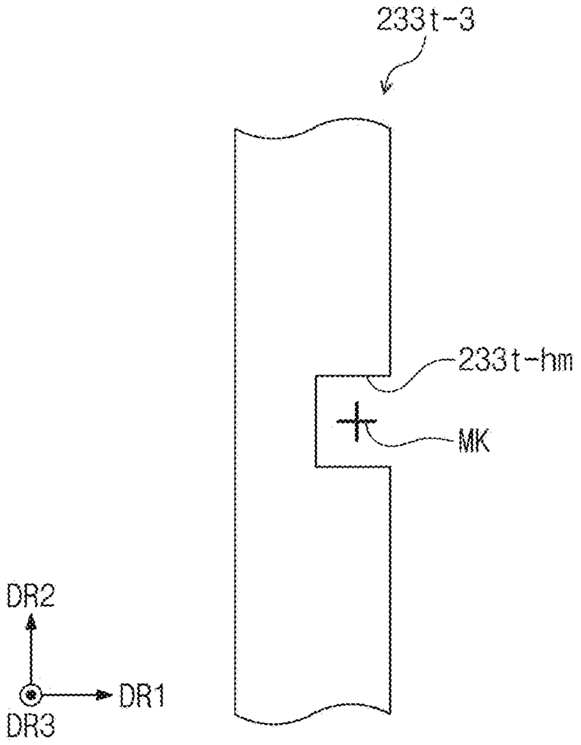
FIG. 16A is a plan view illustrating a loop trace line and a mark pattern according to one or more embodiments of the present disclosure.

FIG. 15 is a cross-sectional view taken along the line I-I' illustrated in FIG. 11 according to one or more embodiments of the present disclosure. FIG. 16A is a plan view illustrating a loop trace line and a mark pattern according to one or more embodiments of the present disclosure.

Referring to FIGS. 11, 15, and 16A, at least one of the display layer 100 or the sensor layer 200 may further include a mark pattern MK that is located to overlap the non-display area 100NA. In FIG. 15, it is illustrated as an example that the mark pattern MK is located at the same layer as the first layer line 220*ta*, but the present disclosure is not particularly limited thereto. For example, the mark pattern MK may be located at the same layer as the first connection electrode CNE1 described in FIG. 7A or on the same layer as the second connection electrode CNE2.

Even though the third line portion 233*t*-3 extends to an area that overlaps the first dam part DM1, a groove 233*t*-*hm* may be defined at a portion that overlaps the mark pattern MK, as shown in FIG. 16A. For example, a cross-sectional view in an area, in which the mark pattern MK is not located, may be substantially the same as the cross-sectional view illustrated in FIG. 14.

When viewed on a plane, the mark pattern MK and the third line portion 233*t*-3 may not overlap each other. Accordingly, the mark pattern MK may be recognized even after the sensor layer 200 is formed.

Figure 16B:
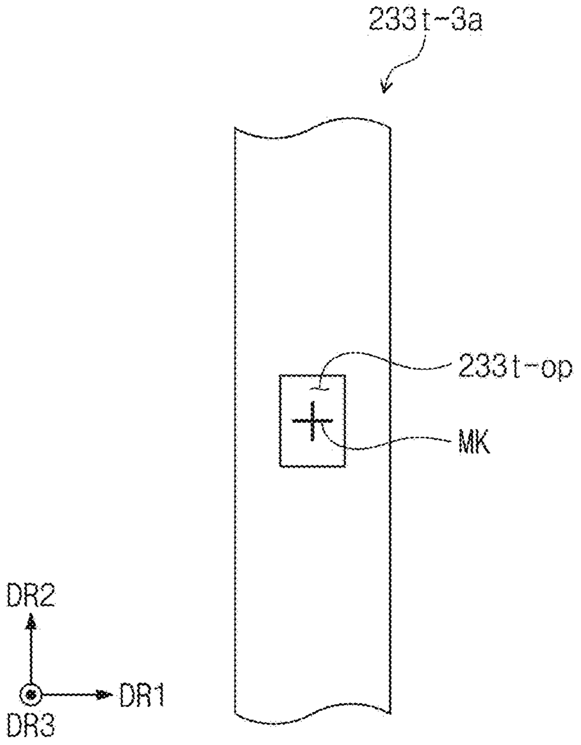
FIG. 16B is a plan view illustrating a loop trace line and a mark pattern according to one or more embodiments of the present disclosure.

FIG. 16B is a plan view illustrating a loop trace line and a mark pattern according to one or more embodiments of the present disclosure.

Referring to FIG. 16B, even though the third line portion 233*t*-3*a* may extend to an area that overlaps the first dam part DM1, an opening 233*t*-*op* may be defined at a portion that overlaps the mark pattern MK. That is, when viewed on a plane, the mark pattern MK and the third line portion 233*t*-3*a* may not overlap each other. Accordingly, the mark pattern MK may be recognized even after the sensor layer 200 is formed.

Figure 16C:
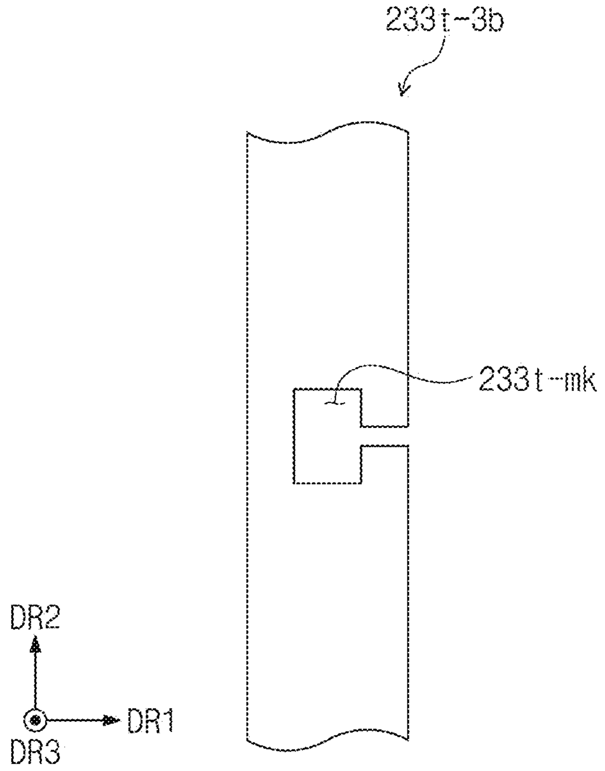
FIG. 16C is a plan view illustrating a loop trace line according to one or more embodiments of the present disclosure.

FIG. 16C is a plan view illustrating a loop trace line according to one or more embodiments of the present disclosure.

Referring to FIG. 16C, a mark opening 233*t*-*mk* may be defined in the third line portion 233*t*-3*b*. As the third line portion 233*t*-3*b* may be located in the non-display area 100NA that does not overlap the common electrode CE, a portion of the third line portion 233*t*-3*b* may be removed to be used as a mark.

The mark pattern MK and mark opening 233*t*-*hm*/233*t*-*op*/233*t*-*mk* illustrated in FIGS. 16A, 16B, and 16C may be utilized during a process of assembling the display panel DP (refer to FIG. 15) with other components, a lamination process, or a process of cutting the display panel DP (refer to FIG. 15).

Figure 17:
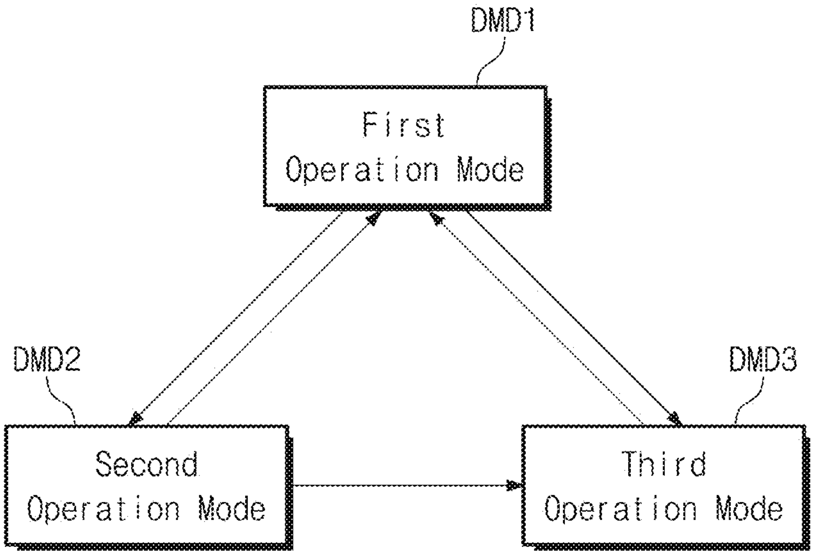
FIG. 17 is a view illustrating an operation of a sensor driver according to one or more embodiments of the present disclosure.

FIG. 17 is a view illustrating an operation of the sensor driver 200C (see FIG. 6) according to one or more embodiments of the present disclosure.

Referring to FIGS. 6 and 17, the sensor driver 200C may be configured to be selectively operated in any one of a first operation mode DMD1, a second operation mode DMD2, and a third operation mode DMD3.

The first operation mode DMD1 may be referred to as a touch-and-pen-standby mode, the second operation mode DMD2 may be referred to as a touch-activation-and-pen-standby mode, and, the third operation mode DMD3 may be referred to as a pen activation mode. The first operation mode DMD1 may be a mode for waiting for the first input 2000 and the second input 3000. The second operation mode DMD2 may be a mode for sensing the first input 2000 and waiting for the second input 3000. The third operation mode DMD3 may be a mode for sensing the second input 3000.

In one or more embodiments of the present disclosure, the sensor driver 200C may be driven first in the first operation mode DMD1. When the first input 2000 is sensed in the first operation mode DMD1, the operation mode of the sensor driver 200C may be switched (or changed) to the second operation mode DMD2. Alternatively, when the second input 3000 is sensed in the first operation mode DMD1, the operation mode of the sensor driver 200C may be switched (or changed) to the third operation mode DMD3.

In one or more embodiments of the present disclosure, when the second input 3000 is sensed in the second operation mode DMD2, the operation mode of the sensor driver 200C may be switched to the third operation mode DMD3. When the first input 2000 is terminated (or not sensed) in the second operation mode DMD2, the operation mode of the sensor driver 200C may be switched to the first operation mode DMD1. When the second input 3000 is terminated (or not sensed) in the third operation mode DMD3, the operation mode of the sensor driver 200C may be switched to the first operation mode DMD1.

Figure 18:
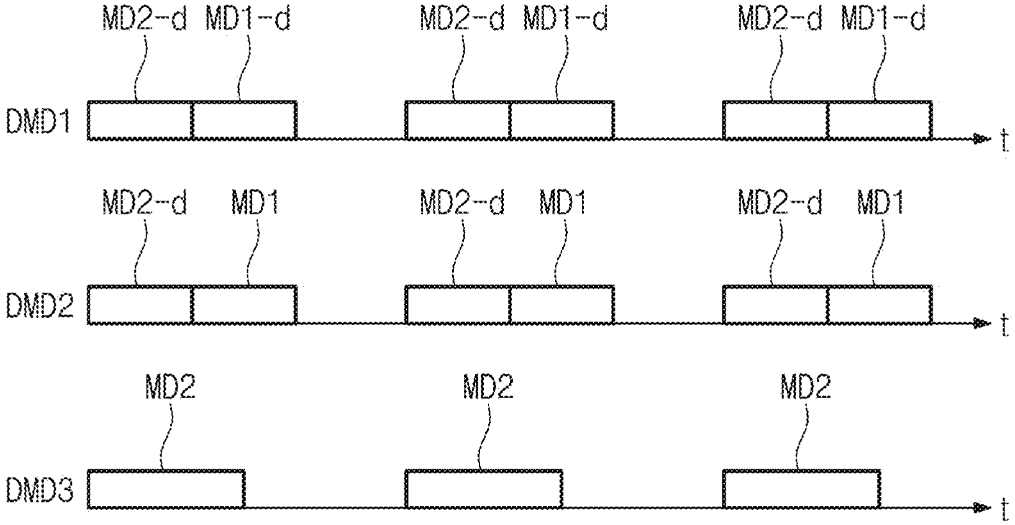
FIG. 18 is a view illustrating an operation of a sensor driver according to one or more embodiments of the present disclosure.

FIG. 18 is a view illustrating an operation of the sensor driver 200C (see FIG. 6) according to one or more embodiments of the present disclosure.

Referring to FIGS. 6, 17, and 18, operations in the first to third operation modes DMD1, DMD2, and DMD3 are illustrated in order of time (t), by way of example.

In the first operation mode DMD1, the sensor driver 200C may be repeatedly operated in a second mode MD2-*d* and a first mode MD1-*d*. During the second mode MD2-*d*, the sensor layer 200 may perform scan driving for detecting the second input 3000. During the first mode MD1-*d*, the sensor layer 200 may perform scan driving to detect the first input 2000. FIG. 18 illustrates that the sensor driver 200C is operated in the first mode MD1-*d* continuously after the second mode MD2-*d*, but the order is not limited thereto.

In the second operation mode DMD2, the sensor driver 200C may be repeatedly operated in a second mode MD2-*d* and a first mode MD1-*d*. During the second mode MD2-*d*, the sensor layer 200 may perform scan driving to detect the second input 3000. During the first mode MD1, the sensor layer 200 may perform scan driving to detect coordinates corresponding to the first input 2000.

In the third operation mode DMD3, the sensor driver 200C may be operated in the second mode MD2. During the second mode MD2, the sensor layer 200 may perform scan driving to detect coordinates corresponding to the second input 3000. In the third operation mode DMD3, the sensor driver 200C may not be operated in the first mode MD1-*d* or MD1 until the second input 3000 is terminated (or not sensed).

Referring to FIG. 8 together, in the first mode MD1-*d* and the first mode MD1, most or all of the third electrodes 230 and the fourth electrodes 240 may be grounded, or a constant voltage may be applied thereto. Alternatively, in the first mode MD1-*d* and the first mode MD1, both the third electrodes 230 and the fourth electrodes 240 may be floated (or electrically floated). Alternatively, in the first mode MD1-*d* and the first mode MD1, a signal of the same phase as that of the transmission signal provided to the first electrodes 210 may be applied to the third electrodes 230 and the fourth electrodes 240. In this case, touch noise introduced through the third electrodes 230 and the fourth electrodes 240 may be reduced or prevented.

In the second mode MD2-*d* and the second mode MD2, all of ends of the third electrodes 230 and the fourth electrodes 240 may be floated. Moreover, in the second mode MD2-*d* and the second mode MD2, the opposite ends of the third electrodes 230 and the fourth electrodes 240 may be grounded or floated. Accordingly, compensation of the sensing signal may be maximized through the coupling between the first electrodes 210 and the third electrodes 230 and the coupling between the second electrodes 220 and the fourth electrodes 240.

Figure 19:
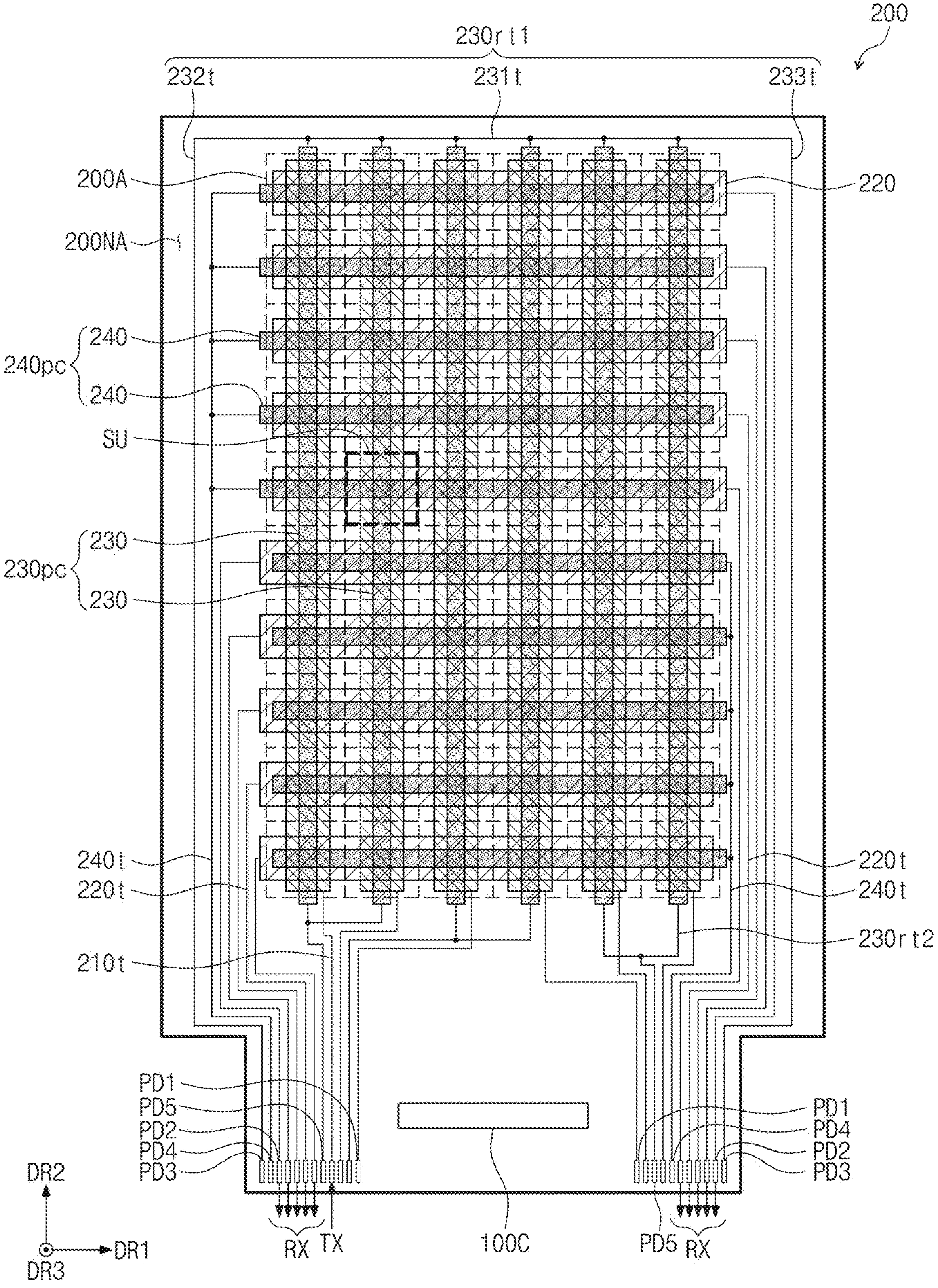
FIG. 19 is a view illustrating a first mode according to one or more embodiments of the present disclosure.

FIG. 19 is a view illustrating a first mode according to one or more embodiments of the present disclosure.

Referring to FIGS. 6, 18, and 19, the first mode MD1-*d* of the first operation mode DMD1, and the first mode MD1 of the second operation mode DMD2, may include a mutual capacitance detection mode. FIG. 19 is a view illustrating a mutual capacitance detection mode in the first mode MD1-*d* of the first operation mode DMD1 and the first mode MD1 of the second operation mode DMD2.

In the mutual capacitance detection mode, the sensor driver 200C may sequentially provide a transmission signal TX to the first electrodes 210, and may detect coordinates for the first input 2000 by using a reception signal RX detected through the second electrodes 220. For example, the sensor driver 200C may be configured to calculate input coordinates by sensing changes in mutual capacitance between the first electrodes 210 and the second electrodes 220.

FIG. 19 illustrates that the transmission signal TX is provided to the one first electrode 210, and the reception signal RX is output from the second electrodes 220, by way of example. The sensor driver 200C may detect input coordinates of the first input 2000 by sensing a change in capacitance between the first electrode 210 and each of the second electrodes 220.

In one or more other embodiments of the present disclosure, at least one of the first mode MD1-*d* of the first operation mode DMD1 or the first mode MD1 of the second operation mode DMD2 may further include a magnetic capacitance detection mode. In the self-capacitance detection mode, the sensor driver 200C may be configured to output driving signals to the first electrodes 210 and the second electrodes 220, and to calculate input coordinates by sensing changes in capacitance between the first electrodes 210 and the second electrodes 220.

Figure 20:
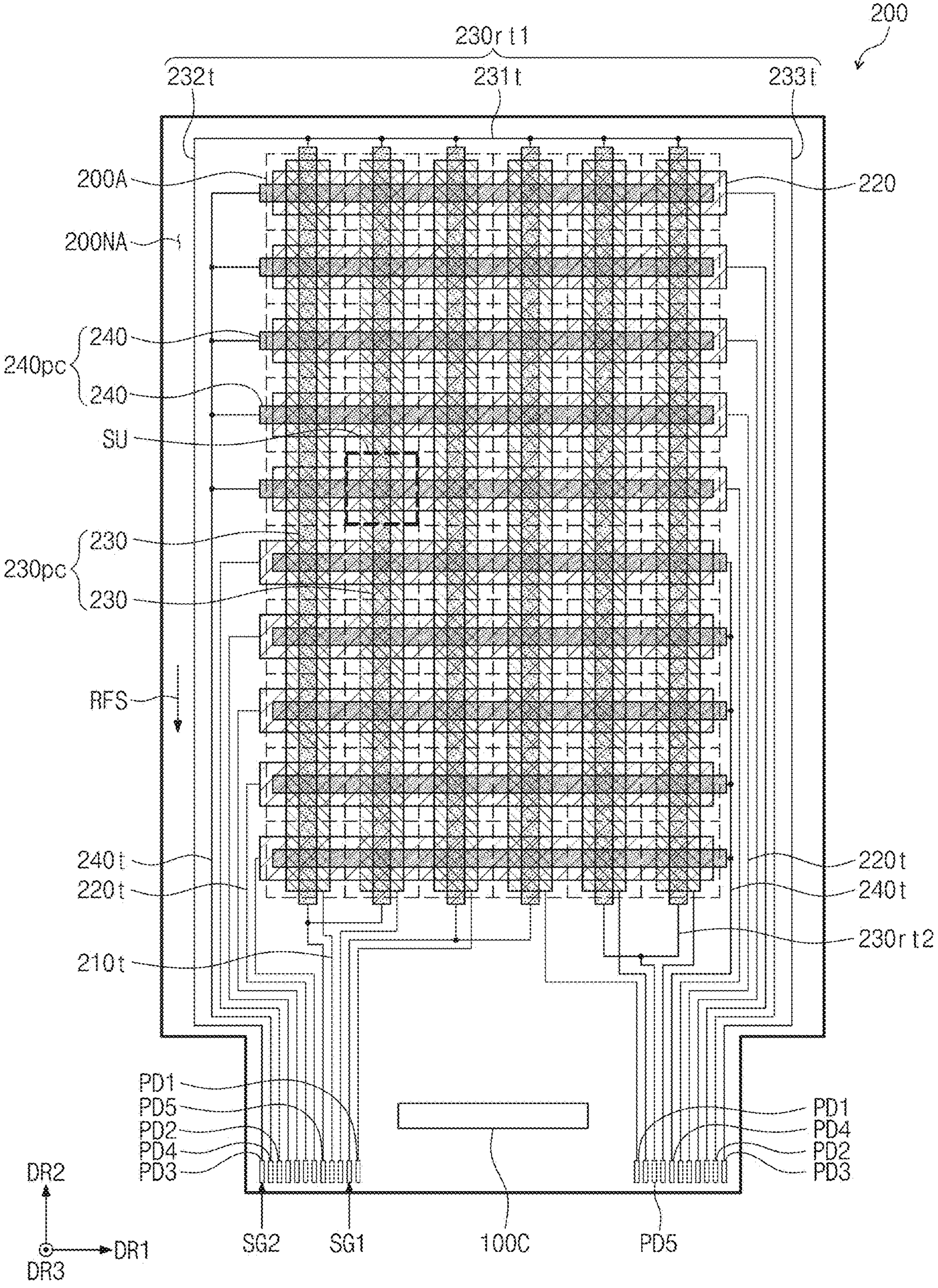
FIG. 20 is a view illustrating a second mode according to one or more embodiments of the present disclosure.
Figure 21A:
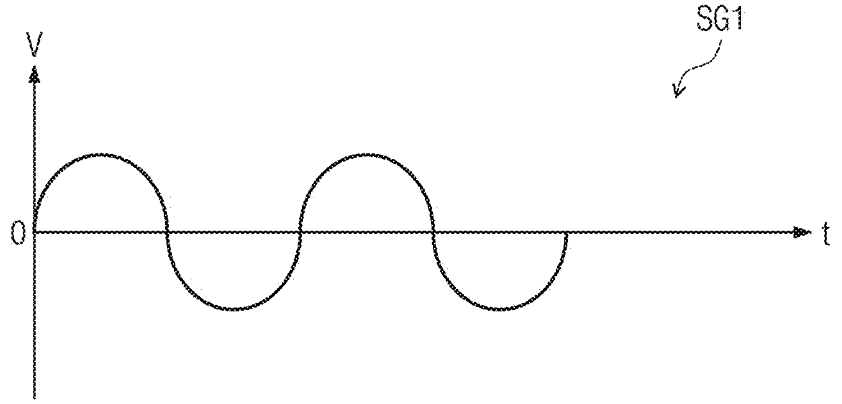
FIG. 21A is a graph illustrating a waveform of a first signal according to one or more embodiments of the present disclosure.
Figure 21B:
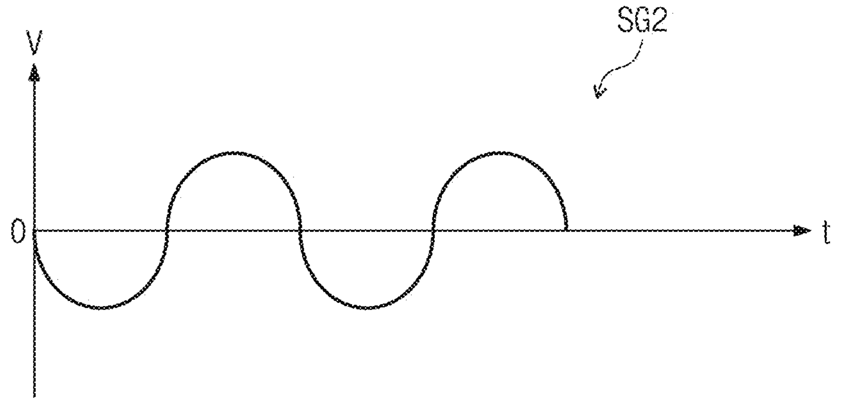
FIG. 21B is a graph illustrating a waveform of a second signal according to one or more embodiments of the present disclosure.

FIG. 20 is a view illustrating a second mode, particularly a charging-driving mode according to one or more embodiments of the present disclosure. FIG. 21A is a graph illustrating a waveform of a first signal according to one or more embodiments of the present disclosure. FIG. 21B is a graph illustrating a waveform of a second signal according to one or more embodiments of the present disclosure.

Referring to FIGS. 20, 21A, and 21B, the second mode MD2 may include a charging-driving mode. The charging-driving mode may include a search-charging-driving mode and a tracking-charging-driving mode.

The search-charging-driving mode may be a driving mode before a location of the pen is sensed. Accordingly, a first signal SG1 or a second signal SG2 may be provided to all channels included in the sensor layer 200. That is, an entire area of the sensor layer 200 may be scanned in the search-charging-driving mode. When the pen PN is sensed in the search-charging-driving mode, the sensor layer 200 may be driven for tracking charging. For example, in the tracking-charging-driving mode, the sensor driver 200C may sequentially output the first signal SG1 and the second signal SG2 not the entire sensor layer 200 but to an area that overlaps a point, at which the pen PN is sensed In the charging-driving mode, the sensor driver 200C may apply the first signal SG1 to one of third pads PD3 and fifth pads PD5, and may apply the second signal SG2 to another pad. The second signal SG2 may be a reverse signal of the first signal SG1. For example, the first signal SG1 may be a sinusoidal signal.

Because the first signal SG1 and the second signal SG2 are applied to at least two pads, a current RFS may have a current path, in which it flows through one pad to the other pad. Furthermore, because the first signal SG1 and the second signal SG2 are sinusoidal signals having a reverse-phase relationship to each other, the direction of the current RFS may be changed periodically. In one or more embodiments of the present disclosure, the first signal SG1 and the second signal SG2 may be square wave signals having a reverse-phase relationship to each other.

When the first signal SG1 and the second signal SG2 have a reverse-phase relationship, noise caused by the first signal SG1 in the display layer 100 (see FIG. 6) may be canceled out with noise caused by the second signal SG2. Accordingly, a flicker may not occur in the display layer 100, and the display quality of the display layer 100 may be improved.

In one or more embodiments of the present disclosure, the first signal SG1 may be a sinusoidal signal. However, one or more embodiments is not limited thereto, and the first signal SG1 may be a square wave signal. Besides, the second signal SG2 may have a constant voltage (e.g., predetermined constant voltage). For example, the second signal SG2 may be a ground voltage. In other words, it is identified that a pad, to which the second signal SG2 is applied, is grounded. In this case, the current RFS may flow from one pad to the other pad. Also, because the first signal SG1 is a sinusoidal wave signal or square wave signal even when the other pad is grounded, the direction of the current RFS may be changed periodically.

Referring to FIG. 20, the second signal SG2 is provided through one third pad PD3 that is connected to a first loop trace line 230*rt*1, and the first signal SG1 is provided through one fifth pad PD5 that is connected to the third electrode 230. The current RFS may flow through a current path that is defined by the fifth pad PD5, the second loop trace line 230*rt*2 connected to the fifth pad PD5, the third electrode 230, a portion of the first loop trace line 230*rt*1, which is connected to the third pad PD3, and the third pad PD3. The current path may have the form of a coil. Accordingly, in the charging-driving mode of the second mode, the resonant circuit of the pen PN may be charged by the current path.

According to the present disclosure, a current path of the loop coil pattern may be implemented by the components included in the sensor layer 200. Accordingly, the electronic device 1000 (see FIG. 2A) may charge the pen PN by using the sensor layer 200. Accordingly, because there is no need to add a separate configuration having a coil for charging the pen PN, the thickness, weight, and degradation of the flexibility of the electronic device 1000 may not occur.

In the charging-driving mode, the first electrodes 210, the second electrodes 220, and the fourth electrodes 240 may be grounded, or may not be applied with a constant voltage, or may be electrically floated. For example, the first electrodes 210, the second electrodes 220, and the fourth electrodes 240 may be floated. In this case, the current RFS may not flow to the first electrodes 210, the second electrodes 220, and the fourth electrodes 240.

Figure 22A:
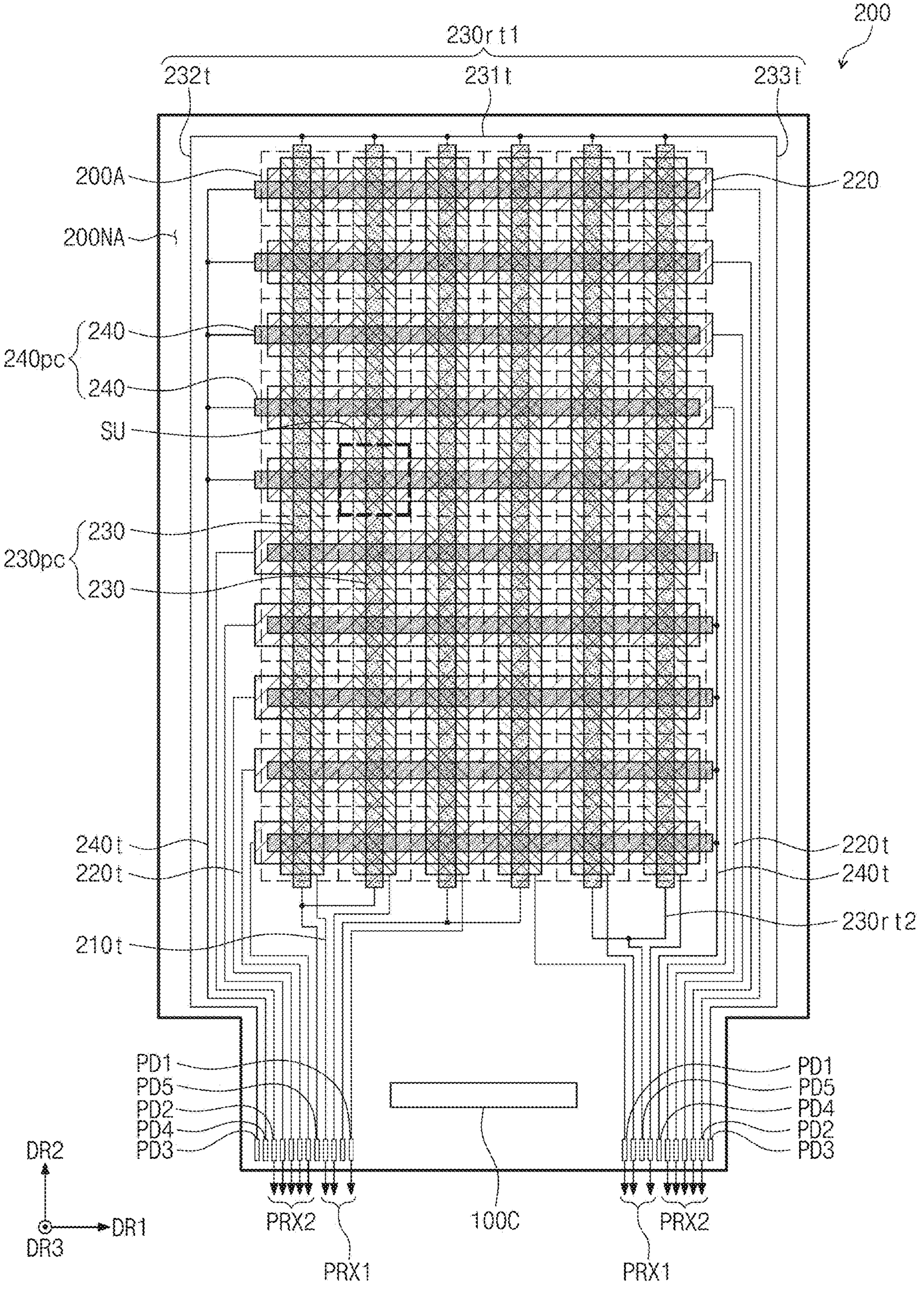
FIG. 22A is a view illustrating a second mode according to one or more embodiments of the present disclosure.
Figure 22B:
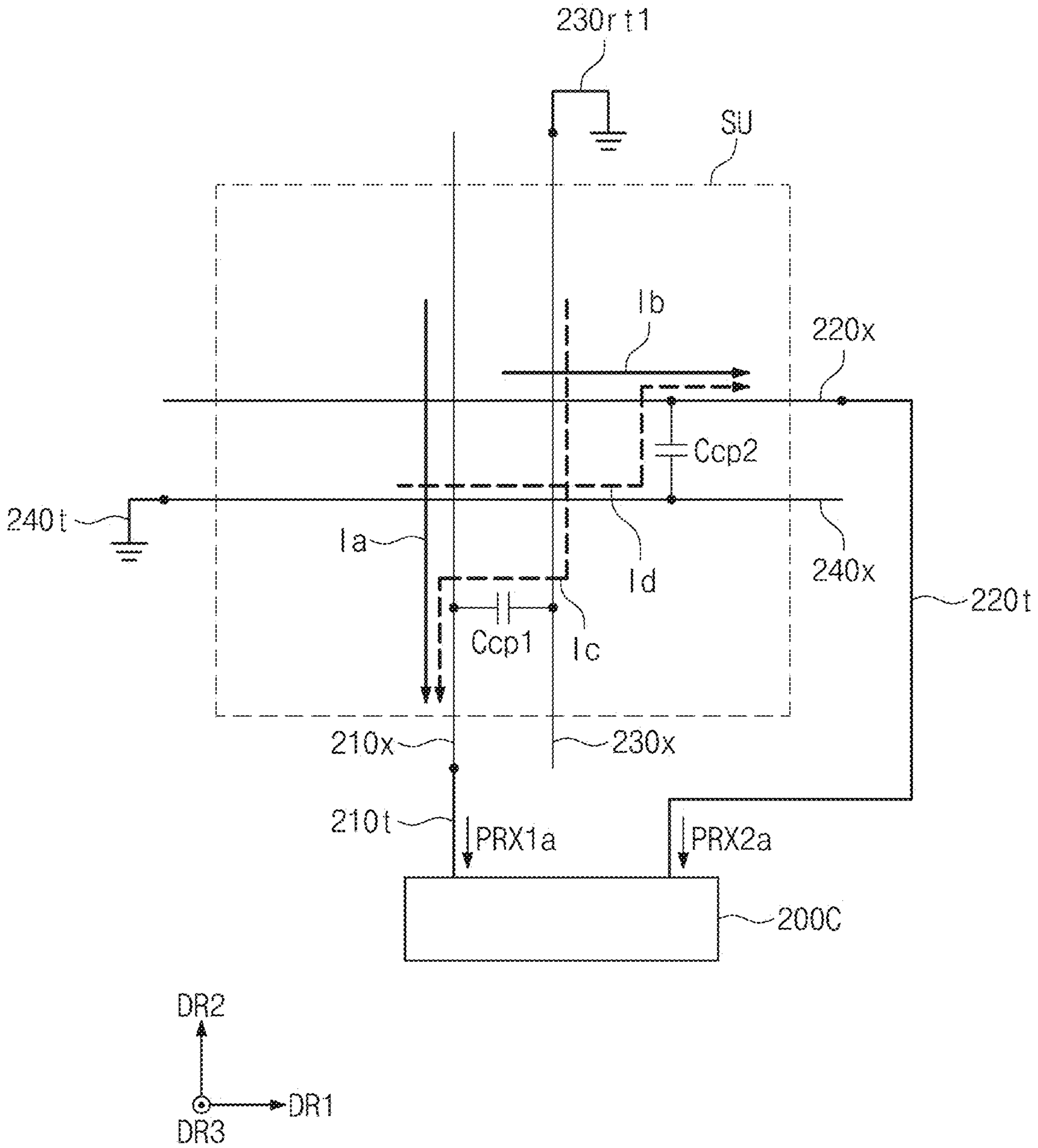
FIG. 22B is a view illustrating a second mode based on one sensing unit according to one or more embodiments of the present disclosure.

FIG. 22A is a view illustrating a second mode according to one or more embodiments of the present disclosure. FIG. 22B is a view illustrating a second mode based on one sensing unit according to one or more embodiments of the present disclosure.

Referring to FIGS. 22A and 22B, a second mode may include a charging-driving mode and a pen-sensing driving mode. FIGS. 22A and 22B are views illustrating the pen-sensing driving mode.

Referring to FIG. 22A, in the pen-sensing driving mode, first reception signals PRX1 may be output from the first electrodes 210, and second reception signals PRX2 may be output from the second electrodes 220. One sensing unit SU, through which the first to fourth induction currents (Ia, Ib, Ic, and Id) generated by the pen PN flow, is illustrated in FIG. 22B.

Referring to FIGS. 22A and 22B, in one or more embodiments of the present disclosure, routing directions of one electrode and another electrode of the sensor layer 200, which overlap each other, may be different. For example, the routing direction of the first electrode 210*x* and the routing direction of the third electrode 230*x* may be different. Furthermore, the routing direction of the second electrode 220*x* and the routing direction of the fourth electrode 240*x* may be different. For example, in FIG. 22B, the first electrode 210*x* and the first trace line 210*t* may be connected to each other at a lower portion of the sensing unit SU, and the third electrode 230*x* and the first loop trace line 230*rt*1 may be connected to each other at an upper portion of the sensing unit SU. The second electrode 220*x* and the second trace line 220*t* may be connected to each other on the right side of the sensing unit SU, and the fourth electrode 240*x* and the auxiliary trace line 240*t* may be connected to each other on the left side of the sensing unit SU.

An RLC resonant circuit of the pen PN may emit a magnetic field at a resonant frequency while discharging charged charges. Due to the magnetic field provided by the pen PN, a first induced current Ia may be generated in the first electrode 210*x*, and a second induced current Ib may be generated in the second electrode 220*x*. Furthermore, a third induced current Ic may be generated in the third electrode 230*x*, and a fourth induced current Id may be generated in the fourth electrode 240*x*.

A first coupling capacitor Ccp1 may be formed between the third electrode 230*x* and the first electrode 210*x*, and a second coupling capacitor Ccp2 may be formed between the fourth electrode 240*x* and the second electrode 220*x*. The third induced current Ic may be delivered to the first electrode 210 through the first coupling capacitor Ccp1, and the fourth induced current Id may be delivered to the second electrode 220 through the second coupling capacitor Ccp2.

The sensor driver 200C may receive a first reception signal PRX1*a* based on the first induced current Ia and the third induced current Ic from the first electrode 210*x*, and may receive a second reception signal PRX2*a* based on the second induced current Ib and the fourth induced current Id from the second electrode 220*x*. The sensor driver 200C may detect input coordinates of the pen PN based on the first reception signal PRX1*a* and the second reception signal PRX2*a*.

The sensor driver 200C may receive the first reception signal PRX1*a* from the first electrode 210*x* and may receive the second reception signal PRX2*a* from the second electrode 220*x*. In this case, most or all ends of the third electrode 230*x* and the fourth electrode 240*x* may be floated. Accordingly, the sensing signal may be maximally compensated for through the coupling between the first electrode 210*x* and the third electrode 230*x* and the coupling between the second electrodes 220*x* and the fourth electrode 240*x*.

Furthermore, the opposite ends of the third electrode 230*x* and the fourth electrode 240*x* may be grounded or floated. Accordingly, the third induced current Ic and the fourth induced current Id may be sufficiently delivered to the first electrode 210*x* and the second electrode 220*x* through the coupling between the first electrode 210*x* and the third electrode 230*x* and by the coupling between the second electrode 220*x* and the fourth electrodes 240*x*.

According to the above description, the loop trace line includes the first line portion that is connected to the plurality of third electrodes, the second line portion that extends from an end of the first line portion, and a third line portion that extends from an opposite end of the first line portion. The second line portion and the third line portion may extend in the same direction as the extension direction of each of the third electrodes, and may be located in an area that does not overlap the common electrode. In this case, the degree of freedom of design of each of the second line portion and the third line portion may be improved, and thus, the resistance of each of the second line portion and the third line portion may be further reduced. Accordingly, the pen may be sufficiently charged through a current path including the second line portion or the third line portion. As a result, a pen-charging performance of the electronic device may be improved. That is, as a charging rate of the pen is improved, a signal-to-noise ratio of a signal that is provided from the pen may increase. Accordingly, a linearity and an accuracy with respect to a pen input may be improved.

Although one or more embodiments of the present disclosure has been described for illustrative purposes, those skilled in the art will appreciate that various modifications, and substitutions are possible, without departing from the scope and spirit of the present disclosure as disclosed in the accompanying claims.

Accordingly, the technical scope of the present disclosure should not be limited to the contents described in the detailed description of the specification but should be defined by the claims, with functional equivalents thereof to be included therein.

What is claimed is:

1. An electronic device comprising:

a display layer defining a display area configured to display an image, and a non-display area adjacent to the display area, and comprising a light-emitting element comprising a pixel electrode in the display area, an emission layer above the pixel electrode, a common electrode above the emission layer, and a dam part in the non-display area; and a sensor layer above the display layer and configured to sense an external input, and comprising:

first electrodes arranged along a first direction;

second electrodes arranged along a second direction crossing the first direction;

third electrodes arranged along the first direction;

first trace lines electrically connected to the first electrodes in one-to-one correspondence;

second trace lines electrically connected to the second electrodes in one-to-one correspondence; and a loop trace line comprising:

a first line portion electrically connected to the third electrodes and extending along the first direction;

a second line portion extending from an end of the first line portion in the second direction, and spaced from the common electrode in the non-display area in plan view; and a third line portion extending from an opposite end of the first line portion in the second direction, and spaced from the common electrode in the non-display area in plan view.

2. The electronic device of claim 1, wherein the second line portion is between the common electrode and the dam part in plan view, and wherein the third line portion is between the common electrode and the dam part in plan view.

3. The electronic device of claim 1, wherein the common electrode is between the second line portion and the third line portion in plan view.

4. The electronic device of claim 1, wherein the second trace lines overlap the common electrode.

5. The electronic device of claim 1, wherein the display layer further comprises a first inorganic encapsulation layer covering the light-emitting element, an organic encapsulation layer above the first inorganic encapsulation layer and spaced from the second line portion and the third line portion in plan view, and a second inorganic encapsulation layer above the organic encapsulation layer and covering the organic encapsulation layer.

6. The electronic device of claim 1, wherein the second line portion and the third line portion comprise a first layer line, and a second layer line above and electrically connected to the first layer line, and wherein the sensor layer comprises an intermediate insulating layer between the first layer line and the second layer line, and defining a contact hole through which the second layer line passes.

7. The electronic device of claim 6, wherein the first layer line and the second layer line are spaced from the dam part in plan view.

8. The electronic device of claim 6, wherein the first layer line and the second layer line overlap the dam part.

9. The electronic device of claim 1, wherein the second trace lines comprise a first layer line, and a second layer line above the first layer line and at a same layer as the second line portion and the third line portion.

10. The electronic device of claim 9, wherein the second line portion and the third line portion overlap the dam part.

11. The electronic device of claim 1, wherein at least one of the sensor layer or the display layer further comprises a mark pattern overlapping the non-display area and spaced from the loop trace line in plan view.

12. The electronic device of claim 11, wherein the loop trace line defines an opening overlapping the mark pattern.

13. The electronic device of claim 1, wherein portions of the dam part facing the second line portion and the third line portion extend along the second direction.

14. An electronic device comprising:

a base layer;

a circuit layer above the base layer;

a light-emitting element layer comprising a dam part, and a light-emitting element surrounded by the dam part in plan view and comprising a pixel electrode above the circuit layer, an emission layer above the pixel electrode, and a common electrode above the emission layer;

an encapsulation layer covering the light-emitting element layer and comprising a first inorganic encapsulation layer covering the light-emitting element, an organic encapsulation layer above the first inorganic encapsulation layer, and a second inorganic encapsulation layer above the organic encapsulation layer and covering the organic encapsulation layer; and a sensor layer above the encapsulation layer, configured to sense an external input, and comprising:

first electrodes arranged along a first direction;

second electrodes arranged along a second direction crossing the first direction;

third electrodes arranged along the first direction;

first trace lines electrically connected to the first electrodes in one-to-one correspondence;

second trace lines electrically connected to the second electrodes in one-to-one correspondence; and a loop trace line comprising:

a first line portion electrically connected to the third electrodes and extending along the first direction;

a second line portion extending from an end of the first line portion in the second direction and spaced from the organic encapsulation layer in a non-display area in plan view; and a third line portion extending from an opposite end of the first line portion in the second direction and spaced from the organic encapsulation layer in the non-display area in plan view.

15. The electronic device of claim 14, wherein the second line portion and the third line portion are spaced from the common electrode in plan view.

16. The electronic device of claim 14, wherein the second line portion is between the common electrode and the dam part in plan view, and wherein the third line portion is between the common electrode and the dam part in plan view.

17. The electronic device of claim 14, wherein the second line portion and the third line portion overlap the dam part.

18. The electronic device of claim 14, wherein the second trace lines comprise a first layer line, and a second layer line above the first layer line and at a same layer as the second line portion and the third line portion.

19. An electronic device comprising:

a base layer;

a circuit layer above the base layer;

a light-emitting element layer comprising a dam part, and a light-emitting element surrounded by the dam part in plan view and comprising a pixel electrode above the circuit layer, an emission layer above the pixel electrode, and a common electrode above the emission layer;

an encapsulation layer covering the light-emitting element layer;

charging electrodes above the encapsulation layer, configured to sense an external input, and arranged along a first direction; and a loop trace line comprising a first line portion electrically connected to the charging electrodes and extending along the first direction, a second line portion spaced from the common electrode in a non-display area in plan view and extending from an end of the first line portion in a second direction crossing the first direction, and a third line portion spaced from the common electrode in the non-display area in plan view and extending from an opposite end of the first line portion in the second direction.

20. The electronic device of claim 19, further comprising second trace lines comprising a first layer line, and a second layer line above the first layer line, wherein the encapsulation layer comprises a first inorganic encapsulation layer covering the light-emitting element, an organic encapsulation layer above the first inorganic encapsulation layer, and a second inorganic encapsulation layer above the organic encapsulation layer and covering the organic encapsulation layer, and wherein the second line portion and the third line portion are spaced from the organic encapsulation layer in plan view, are at a same layer as the second layer line, and overlap the dam part.

* * * * *